United States Patent
Noumi et al.

(10) Patent No.: US 6,317,174 B1
(45) Date of Patent: Nov. 13, 2001

(54) TFT ARRAY SUBSTRATE, LIQUID CRYSTAL DISPLAY USING TFT ARRAY SUBSTRATE, AND MANUFACTURING METHOD THEREOF

(75) Inventors: Shigeaki Noumi; Kouji Yabushita, both of Kumamoto (JP)

(73) Assignee: Kabushiki Kaisha Advanced Display, Kumamoto (JP)

( * ) Notice: Subject to any disclaimer, the term of this patent is extended or adjusted under 35 U.S.C. 154(b) by 0 days.

(21) Appl. No.: 09/667,492

(22) Filed: Sep. 22, 2000

Related U.S. Application Data

(62) Division of application No. 09/437,090, filed on Nov. 9, 1999.

(51) Int. Cl.[7] ............ G02F 1/136; H01L 21/00; H01L 21/338; H01L 21/331
(52) U.S. Cl. .............. 349/42; 349/43; 349/48; 438/30; 438/180; 438/365
(58) Field of Search ................ 349/42, 43, 48; 438/30, 180, 365

(56) References Cited

U.S. PATENT DOCUMENTS

| | | | |
|---|---|---|---|
| 5,343,216 | * 8/1994 | Katayama et al. | 345/92 |
| 5,731,855 | * 3/1998 | Koyama et al. | 349/43 |
| 5,781,253 | * 7/1998 | Koike et al. | 349/40 |
| 5,798,812 | * 8/1999 | Nishiki et al. | 349/152 |
| 5,946,060 | * 8/1999 | Nishiki et al. | 349/48 |
| 5,999,235 | * 12/1999 | Takeguchi et al. | 349/42 |
| 6,005,648 | * 12/1999 | Zhang et al. | 349/43 |

FOREIGN PATENT DOCUMENTS

| | | |
|---|---|---|
| 4-163528 | 6/1992 | (JP) . |
| 2521752 | 5/1996 | (JP) . |
| 2598420 | 1/1997 | (JP) . |
| 9-90397 | 4/1997 | (JP) . |
| 9-127553 | 5/1997 | (JP) . |
| 9-152625 | 6/1997 | (JP) . |

* cited by examiner

*Primary Examiner*—Kenneth Parker
*Assistant Examiner*—Mike Qi
(74) *Attorney, Agent, or Firm*—McDermott, Will & Emery

(57) ABSTRACT

A manufacturing method of a liquid crystal display is provided. The liquid crystal display having a picture element electrode formed on the uppermost layer of a structure is capable of reducing connection resistance between picture element electrode and drain electrode through interlayer insulating film. At the time of forming the picture element electrode, ITO film can be patterned into a desirable pattern without short circuit between assembled terminals in one etching process.

In the process of forming a contact hole 112 for connecting the picture element electrode 113 and the drain electrode 108 on the interlayer insulating film 111 and on the passivation film 110, a dry etching condition is established so that after the ashing process using $O_2$ gas to remove residue on the bottom of the contact hole 112, an etching process using fluorine gas+$O_2$ gas etc. is performed to reduce irregularity on the surface of the interlayer insulating film 111.

17 Claims, 18 Drawing Sheets

TFT ARRAY SUBSTRATE, LIQUID CRYSTAL DISPLAY USING TFT ARRAY SUBSTRATE, AND MANUFACTURING METHOD THEREOF

This application is a division of Ser. No. 09/437090, filed Nov. 9, 1999.

BACKGROUND OF THE INVENTION

1. Technical Field

The present invention relates to an active matrix type TFT array substrate on which a thin film transistor (hereinafter referred to as TFT) is mounted to serve as a switching element, to a liquid crystal display using the TFT array substrate, and to a manufacturing method of them.

2. Background Art

Researches and developments of liquid crystal display to serve as a flat panel display in substitution for CRT have been popularly carried out. In particular, making use of its feature of small power consumption and small thickness, several liquid crystal displays have been heretofore put into practical use to serve as a display for ultra small size television or for notebook type personal computer driven by battery. As a drive method of the liquid crystal display, an active matrix type TFT array is principally used in which TFT is used as a switching element from the viewpoint of high display quality.

To achieve small power consumption in the liquid crystal display, it is effective to increase an effective display area of picture element section of the liquid crystal panel, i.e., to enhance aperture ratio of picture element. As a TFT array effective for achieving a liquid crystal panel of a high aperture ratio, for example, the Japanese Patent Publication (examined) Nos.2521752 and 2598420 and tile Japanese Laid-Open Patent Publication (unexamined) No.163528/1992, etc. disclose a structure. In this structure, after forming a TFT comprising a scanning electrode, a signal electrode and a semiconductor layer, an interlayer insulating film composed of a transparent resin is formed to coat the TFT, and a picture element electrode is formed on the uppermost layer.

A high aperture ratio is achieved in the mentioned structure principally by following two reasons. In the first place, as the picture element electrode is formed on the interlayer insulating film of transparent resin of which surface is flattened, it is possible to prevent a deficient display (domain phenomenon) caused by irregular orientation of liquid crystal molecules occurring at the step portion of the picture element electrode of the conventional structure, whereby it becomes possible to increase an effective display area. In the second place, by forming the picture element electrode on the relatively thick interlayer insulating film of 0.3 $\mu$m to 2 $\mu$m in thickness, no electric short circuit takes place between the scanning line or signal line located at the lower layer of the interlayer insulating film and the picture element electrode located on the upper layer, and therefore it becomes possible to form the picture element electrode in wider area to overlap those lines.

A manufacturing process of the mentioned known TFT array of high aperture ratio is hereinafter described. First, a TFT comprising gate electrode, gate insulating film, semiconductor layer, source electrode, and drain electrode is formed on a transparent insulating substrate such as glass substrate. Then, an interlayer insulating film composed of a transparent resin of which surface is flattened so as not to produce any step caused by the TFT is formed, and a contact hole is formed at required portions. Finally, a picture element electrode composed of a transparent conductive film such as ITO is formed, thus a TFT array being completed. The picture element electrode is electrically connected to the drain electrode on the lower layer through the contact hole formed in the interlayer insulating film.

As described in the Japanese Laid-Open Patent Publications (unexamined) Nos.127553/1997 and 152625/1997, methods for forming a contact hole in the interlayer insulating film are classified into one method in which a photosensitive transparent resin (having a photo-sensitivity) is used, and into another method in which non-photosensitive transparent resin (having no photosensitivity) is used. In the case of using a photosensitive transparent resin, a required contact hole is formed by a photomechanical process, without using any resist, in which exposure and development are performed using a mask pattern of the contact hole after application and baking of the resin. On the other hand, in the case of using a non-photosensitive transparent resin, after applying and baking the resin, a resist is applied. Then, after forming a contact pattern by photomechanical process, a dry etching is performed using a gas containing at least one of $CF_4$, $CF_3$ or $SF_6$, and finally by removing the resist, a required contact hole is achieved.

On the mentioned TFT array substrate, terminals 15 electrically connected to each of the date line, the source lines, etc. are arranged on the periphery of the image display section, whereby a terminal region for connecting each terminal to an external terminal is formed. FIG. 18 is a partially top view showing an active matrix type TFT array substrate of high aperture ratio according to the prior art. In the drawing, reference numeral 1 indicates a glass substrate being a transparent insulating film, numeral 2 indicates a gate line formed on the glass substrate 1, and numeral 3 indicates a source line crossing over the gate line 2. Numeral 4 is a gate terminal electrically connected to the gate line 2, and numeral 5 is a source terminal electrically connected to the source line 3. Numeral 6 is an interlayer insulating film composed of a photosensitive transparent resin formed to cover the entire gate line 2 and source line 3 and end portions of the image display section side of the gate terminal 4 and the source terminal 5. Numeral 1 is a guard resistance, numeral 8 is a contact hole of the terminal section, and numeral 9 is a contact hole of the guard resistance section. Numeral 14 is a short ring which is formed to prevent an electrostatic destruction of the TFT at the time of manufacturing thereof, and connects electrically respective terminals to each other through the guard resistance 7.

In the active matrix type substrate of above arrangement, at the end portions on the image display section side of the gate terminal 4 and the source terminal 5, a metallic wiring on the lower layer such as gate line 2, source line 3, etc. and a transparent conductive film on the upper layer are connected to each other through the contact hole 8 formed in the interlayer insulating film 6. On the other hand, since the interlayer insulating film 6 is not formed at the end portion on the guard resistance 7 side of each terminal and at the guard resistance section 7, a photomechanical process is separately required to form, for example, the contact hole 9 in the guard resistance section.

A transparent conductive film such as ITO is used as a picture element electrode and an upper conductive film of the gate terminal 4 and the source terminal 5, and this ITO is formed by forming a film on the entire substrate and patterning the film. However, there is a difference in the manner of crystal growth and in etching speed between the ITO formed on the interlayer insulating film 6 which is an organic film and the ITO formed on the glass substrate 1 or on an inorganic film. For example, etching speed of the ITO formed on the organic film is faster than that of the ITO formed on the inorganic film by 2 to 5 times. In the actual manufacturing process, from the viewpoint of is patterning precision of the picture element electrode, it is necessary to set an etching time to that for the image display section in which the ITO is formed on the interlayer insulating film 6 composed of an organic film. Accordingly, in the terminal region on the guard resistance 7 side where the interlayer insulating film 6 is not formed, there arises a problem that the ITO remains not etched between the adjacent two gate terminals 4, and between two source terminals 5. The ITO left not etched brings about a deficient leak between respective terminals.

To reduce this deficient leak, it was necessary to perform a first etching on the etching condition (at an etching time) applied to the ITO formed on the organic film of faster etching speed, and perform a second etching at car etchsing time applied to the ITO formed on the glass substrate or on the inorganic film, while protecting the ITO on the organic film with a resist. In this manner, since it is necessary for resist pattern and etching to be performed twice, there is a disadvantage that thie manufacturing process becomes unavoidably complicated.

The Japanese Laid-Open Patent Publication (unexamined) No.90397/1997 discloses a method for etching an ITO film in which by causing an interlayer insulating film to remain between the terminals in assembly region, short circuit between the terminals can be prevented and etching process is performed once.

In the conventional liquid crystal display of above arrangement to achieve a TFT array of high aperture ratio, any interlayer insulating film is not formed in the assembly region for electrical connection between an external substrate provided on the outside of the display region of the TFT array substrate and each electrode line. Therefore, in the step of forming the picture element electrode on the interlayer insulating film, it is essential to perform twice the photomechanical process and the etching process, whereby there arise problems such that manufacturing process becomes complicated, and throughput is lowered while cost being increased.

Moreover, to leave the interlayer insulating film betweeen tile terminals, there is a further problem that irregularity due to the interlayer insulating film increases a connection resistance at the time of connecting the terminals to the external substrate.

Generally, the electrical connection between the picture element electrode of the TFT array of above structure and the drain electrode is achieved through the contact hole formed in the interlayer insulating film. In this case, to reduce the connection resistance between the picture element electrode and the drain electrode, after forming the contact hole by dry etching using $CF_4+O_2$, $SF_6+O_2$ or other fluorine gas+$O_2$, an ashing process is performed using $O_2$ gas to remove residue from the contact hole.

However, as the surface of the interlayer insulating film is also etched in the ashing process using the $O_2$ gas, irregularity is formed on the surface of the interlayer insulating film. It was found that such a surface condition of the interlayer insulating film gives an influence on the etching characteristic (adaptability to etching) of the ITO film formed on the interlayer insulating film.

For example, after the etching process using $CF_4+O_2$, $SF_6+O_2$ or other fluorine gas+$O_2$, the surface of the interlayer insulating film is smooth. When forming an ITO film on the interlayer insulating film of such a smooth condition, etching speed of the ITO film on the interlayer insulating film is almost the same as that of ITO film on the transparent insulating substrate. Thus the ITO film can be patterned by one etching process. Actually, in the case of performing an etching process at an optimum etching speed of the ITO film on the transparent insulating substrate, a side etching amount of ITO pattern on the interlayer insulating film is 1 μm or less on one side, thus a desirable ITO pattern is obtained.

However, when performing the ashing process using $O_2$ gas after the etching process using $CF_4+O_2$, $SF_6+O_2$ or other fluorine gas+$O_2$, irregularity is produced on the surface of the interlayer insulating film. When forming an ITO film on the interlayer insulating film of such an irregular surface condition, etching speed of the ITO film on the interlayer insulating film is faster than that of the ITO film on the transparent insulating substrate by 5 times. Therefore, it is impossible to pattern the ITO film by just one etching process. Actually, in the case of performing an etching process at an optimum etching speed of the ITO film on the transparent insulating substrate, a side etching amount of ITO pattern on the interlayer insulating film is 3 μm or more on one side, thus the ITO pattern is formed into an extremely tapered configuration.

As discussed above, in the case of performing the asliifg process with $O_2$ gas to reduce the connection resistance between the picture element electrode and the drain electrode, there arises a problem that it is impossible to pattern the ITO film by just one etching process. On the other hand, in the case of not performing any ashing process with $O_2$ gas, there arises another problem that the ITO film on the interlayer insulating film and the ITO film on the transparent insulating substrate can be certainly patterned by just one etching process, but connection resistance between the picture element electrode and the drain electrode is increased.

OBJECT OF THE INVENTION

The present invention was made to solve the above-discussed problems, and has an object of providing a TFT array substrate of high aperture ratio capable of being manufactured in smaller number of processes than that in the prior arts and capable of preventing a leak between terminals due to residue produced by etching ITO. A manufacturing method of the TFT array substrate and a liquid crystal display using the TFT array substrate are also provided.

Another object of the invention is to provide a manufacturing method of a TFT array substrate of high aperture ratio in smaller number of processes than that in the prior arts, without any photomechanical process conventionally required at the time of forming a contact hole at the opposite end of the image display section side of each terminal and a contact hole of guard resistance section, and in which a contact hole of the drain electrode portion in the image display section and a contact hole of each terminal section and guard resistance section can be simultaneously formed on an interlayer insulating film, by providing the interlayer insulating film not only on the image display section of the substrate but also on the peripheral edge section of the substrate including the guard resistance and a short ring for preventing the electrostatic destruction of the TFT at the time of manufacture, at least from opposite end of the image display section side of each terminal in terminal region.

A further object of the invention is to provide a manufacturing method in which pattern formation of a transparent conductive film can be performed by just one resist pattern formation and etching, without leaving any transparent conductive film between terminals, in spite of performing an etching on the etching conditions applied to the transparent conductive film formed on the interlayer insulating film, by providing an interlayer insulating film between terminals in terminal region so that width of the interlayer insulating film is smaller than the distance between the terminals, and in which it is possible to prevent a deficient leak between terminals due to residue produced by etching The transparent conductive film.

A yet further object of the invention is to provide a manufacturing method in which coverage of the transparent conduct film becomes insufficient, due to existence of a sharp step of an insulating film of which section is not tapered between one terminal and another, and which can prevent deficient leak between the terminals, by providing the insulating film wider and thicker than the terminals on a lower layer of each terminal in terminal region.

A still further object of the invention is to provide a manufacturing method of a liquid crystal display in which connection resistance between picture element electrode and drain electrode can be lowered and stabilized, and at the time of forming the picture element electrode, an ITO film can be patterned by just one etching process without occurring any short circuit between the terminals in assembly region.

A further object of the invention is to provide a manufacturing method of a liquid crystal display of high performance and high aperture ratio at a reasonable cost, in which, for manufacturing the liquid crystal display achieving an improvement in aperture ratio by the steps of forming an interlayer insulating film composed of a transparent resin on electrode lines and on a TFT, flattering a surface of the interlayer insulating resin, and forming a picture element electrode on the uppermost layer, any residue on the bottom portion of a contact hole is exactly removed by optimizing dry etching condition for forming the contact hole to which the picture element electrode and a drain electrode formed on the interlayer insulating film are electrically connected, connection resistance between the picture element electrode and the drain electrode can be reduced by achieving a condition that there is no irregularity on the surface of the interlayer insulating film at the time of forming an ITO film forming the picture element electrode after forming the contact hole, and the ITO film on the interlayer insulating film and the ITO film on the transparent insulating substrate exposed between the terminals in the assembly region can be patterned into a desirable configuration without short circuit between the terminals in one etching process.

DISCLOSURE OF THE INVENTION

A TFT array substrate according to the present invention comprises: a plurality of gate lines provided with a gate electrode and formed on a transparent insulating substrate; a plurality of source lines provided with a source electrode and crossing over the gate lines; a semiconductor layer provided on the gate electrode through a gate insulating film; a thin film transistor comprises of the source electrode and the drain electrode connected to the semiconductor layer; an interlayer insulating film formed on the substrate, and of which surface is flattened so as not to produce any step due to thin film transistor; a picture element electrode composed of a transparent conductive film provided in a wide spread manner on the interlayer insulating film and connected to the drain electrode through a contact hole formed on the interlayer insulating film; and a terminal region in which terminals electrically connected to each of the gate lines and the source lines are arranged on the periphery of an image display section of the substrate to connect each terminal to an external terminal; wherein the interlayer insulating film is provided not only on the image display section side but also on a peripheral edge portion including at least an opposite end of the image display section side of each terminal in the terminal region.

It is preferable that the interlayer insulating film is provided between respective terminals in the terminal region so that width of the interlayer insulating film is smaller than a distance between the terminals.

It is preferable that the interlayer insulating film which is thick and of which section is not tapered is provided between respective terminals in the terminal region so that width of the interlayer insulating film is smaller than thie distance between the terminals.

It is preferable that an insulating film which is thick and of which section is not tapered is provided on a lower layer of each terminal in the terminal region so that width of the insulating film is larger than that of the terminals.

It is preferable that the interlayer insulating film is provided on the entire surface of the terminal region.

It is preferable that the interlayer insulating film is composed of a photosensitive resin.

A liquid crystal display according to the invention comprises a liquid crystal arranged between any of the mentioned TFT array substrates and an opposite electrode substrate having a transparent electrode, a color filter, etc.

A manufacturing method of a TFT array substrate according to the invention comprises: a first step of forming lines such as gate lines, source lines and a thin film transistor on a transparent insulating substrate; a second step of forming an interlayer insulating film not only on an image display section of the substrate but also on a peripheral edge section of the substrate, including a guard resistance and a short ring for preventing electrostatic destruction of the thin film transistor at thie time of manufacture, at least from opposite end of the image display Section side of terminals in a terminal region; a third step of forming contact holes respectively for a drain electrode section, a terminal section and a guard resistance section on the interlayer insulating film; and a fourth step of forming a transparent conductive film such as ITO on the substrate, and forming a picture element electrode, each terminal and the guard resistance by resist patterning and etching.

It is preferable that in the second step, an organic film is used as the interlayer insulating film.

It is preferable that in the second step, a photosensitive resin is used as the interlayer insulating film.

It is preferable that in the fourth step, a resist pattern for each terminal is formed wider than a desired pattern on the interlayer insulating film, and an etching is performed on the etching condition applied to the transparent conductive film formed on a transparent insulating substrate or on an inorganic film.

A manufacturing method of a liquid crystal display according to the invention in which two transparent insulating substrates, at least on either of which an electrode is formed, are adhered facing to each other and a liquid crystal is held between the two transparent insulating substrates comprises: a step of forming a scanning electrode, a scanning electrode line and a scanning electrode line terminal on either of the two transparent insulating substrates; a step of forming an insulating film on the scanning electrode, scanning electrode line and scanning electrode line terminal; a step of forming a semiconductor layer on the scanning electrode through the insulating film; a step of forming a first electrode, a first electrode line and a first electrode line terminal and a second electrode on the semiconductor layer; a step of forming a passivation film on the first electrode, first electrode line, first electrode line terminal and second electrode; a step of forming a contact hole on the second electrode and forming an interlayer insulating film having an aperture in an assembly region in which the scanning electrode line terminal and the first electrode line terminal are formed, by applying a transparent resin having a photosensitivity to the passivation film and by exposure and development thereof; a step of etching the passivation film and the insulating film exposed through the contact hole and the aperture by dry etching using the interlayer insulating film as a mask; and a step of forming a transparent conductive film on the interlayer insulating film, in the contact hole, on the transparent insulating substrates exposed through the aperture, on the scanning electrode line terminal and on the first electrode line terminal, and forming a picture element electrode electrically connected to the second electrode through the contact hole and forming a transparent conductive film pattern on the scanning electrode line terminal and on the first electrode line terminal by patterning in just one etching process; in which surface of the interlayer insulating film after the etching process by dry etching is smooth.

Another manufacturing method of a liquid crystal display according to the invention in which two transparent insulating substrates, at least on either of which an electrode is formed, are adhered facing to each other and a liquid crystal is held between the two transparent insulating substrates comprises: a step of forming a scanning electrode, a scanning electrode line and a scanning electrode line terminal on either of the two transparent insulating substrates; a step of forming an insulating film on the scanning electrode, scanning electrode line and scanning electrode line terminal; a step of forming a semiconductor layer on the scanning electrode through the insulating film; a step of removing the insulating film in an assembly region in which the scanning electrode line terminal and a first electrode line terminal are formed; a step of forming the first electrode, a first electrode line and a first electrode line terminal and a second electrode on the semiconductor layer; a step of forming a passivation film on the first electrode, on the first electrode line, first electrode line terminal and second electrode; a step of forming a contact hole on the second electrode and forming an interlayer insulating film having an aperture in an assembly region in which the scanning electrode line terminal and the first electrode line terminal are formed, by applying a transparent resin having a photosensitivity to the passivation film and by exposure and development thereof; a step of etching the passivation film exposed through the contact hole and the aperture by dry etching using the interlayer insulating film as a mask; and a step of forming a transparent conductive film on the interlayer insulating film, in the contact hole, on the transparent insulating substrates exposed through the aperture, on the scanning electrode line terminal and on the first electrode line terminal, and forming a picture element electrode electrically connected to the second electrode through the contact hole and forming a transparent conductive film pattern on the scanning electrode line terminal and on the first electrode line terminal by patterning in just one etching process; in which surface of the interlayer insulating film after the etching process by dry etching is smooth.

A further manufacturing method of a liquid crystal display according to the invention in which two transparent insulating substrates, at least on either of which an electrode is formed, are adhered facing to each other and a liquid crystal is held between the two transparent insulating substrates comprises: a step of forming a scanning electrode, a scanning electrode line and a scanning electrode line terminal on either of the two transparent insulating substrates; a step of forming an insulating film on the scanning electrode, scanning electrode line and scanning electrode line terminal; a step of forming a semiconductor layer on the scanning electrode through the insulating film; a step of forming a first electrode, a first electrode line and a first electrode line terminal and a second electrode on the semiconductor layer; a step of forming a passivation film on the first electrode, first electrode line, first electrode line terminal and second electrode; a step of forming a contact hole on the second electrode and forming an interlayer insulating film having an aperture in an assembly region in which the scanning electrode line terminal and the first electrode line terminal are formed, by applying a transparent resin having a photosensitivity to the passivation film and by exposure and development thereof; a step of forming a resist by applying a photo-resist and patterning the photo-resist into the same configuration as the interlayer insulating film; a step of removing the resist after etching the passivation film and the insulating film exposed through the contact hole and the aperture by dry etching using the resist as a mask; and a step of forming a transparent conductive film on the interlayer insulating film, in the contact hole, on the transparent insulating substrates exposed through the aperture, on the scanning electrode line terminal and on the first electrode line terminal, and forming a picture element electrode electrically connected to the second electrode through the contact hole and a transparent conductive film pattern on the scanning electrode line terminal and on the first electrode line if terminal by patterning in just one etching process.

A still further manufacturing method of a liquid crystal display according to the invention in which two transparent insulating substrates, at least on either of which an electrode is formed, are adhered facing to each other and a liquid crystal is held between the two transparent insulating substrates comprises: a step of forming a scanning electrode, a scanning electrode line and a scanning electrode line terminal on either of the two transparent insulating substrates; a step of forming an insulating film on the scanning electrode, scanning electrode line and scanning electrode line terminal; a step of forming a semiconductor layer on the scanning electrode through the insulating film; a step of forming a first electrode, a first electrode line and a first electrode line terminal and a second electrode on the semiconductor layer; a step of forming a passivation film on the first electrode, first electrode line, first electrode line terminal and second electrode; a step of forming an interlayer insulating film by applying a transparent resin having no photosensitivity to the passivation film; a step of forming a resist, and removing the resist after forming a contact hole on the second electrode and an aperture in an assembly region in which the scanning electrode line terminal and the first electrode line terminal are formed, by etching the interlayer insulating film, passivation film and insulating film by dry etching; and a step of forming a transparent conductive film on the interlayer insulating film, in the contact hole, on the transparent insulating substrates exposed through the aperture, on the scanning electrode line terminal and on the first electrode line terminal, and forming a picture element electrode electrically connected to the second electrode through the contact hole and forming a transparent conductive film pattern on the scanning electrode line terminal and on the first electrode line terminal by patterning in just one etching process.

It is preferable that the insulating film in the assembly region in which the scanning electrode line terminal and the first electrode line terminal are formed is removed after forming the semiconductor layer and before forming the first electrode, the first electrode line, the first electrode line terminals and the second electrode.

It is preferable that in the etching process by dry etching using t he inter layer insulating film as a mask, an ashing process using $O_2$ gas and a second etching process using $CF_4+O_2$, $SF_6+O_2$ or other fluorine gas+$O_2$ gas are performed, after completing a first etching process using $CF_4+O_2$, $SF_6+O_2$ or other fluorine gas+$O_2$ gas.

It is preferable that in the second etching process using $CF_4+O_2$, $SF_6+O_2$ or other fluorine gas+$O_2$ gas, the etching process is performed in a shorter time or by setting a flow ratio of $O_2$ gas to be higher or by setting a power to be smaller than that in the first etching process using $CF_4+O_2$, $SF_6+O_2$ or other fluorine gas+$O_2$ gas, or by combining at least two of these process conditions.

It is preferable that in etching process conditions by dry etching after forming the resist on the interlayer insulating film, after the etching process using $CF_4+O_2$, $SF_6+O_2$ or other fluorine gas+$O_2$ gas, an ashing process using $O_2$ is performed.

It is preferable that in the etching process using the interlayer insulating film or the resist as a mask, the second etching process using $CF_4+O_2$, $SF_6+O_2$ or other fluorine gas+$O_2$ gas is performed by setting a flow ratio of $O_2$ gas to be higher than that in the first etchling process, after completing the first etching process using $CF_4+O_2$, $SF_6+O_2$ or other fluorine gas+$O_2$ gas.

BEST MODE FOR PRACTICING THE INVENTION

Example 1

Figure 1A:
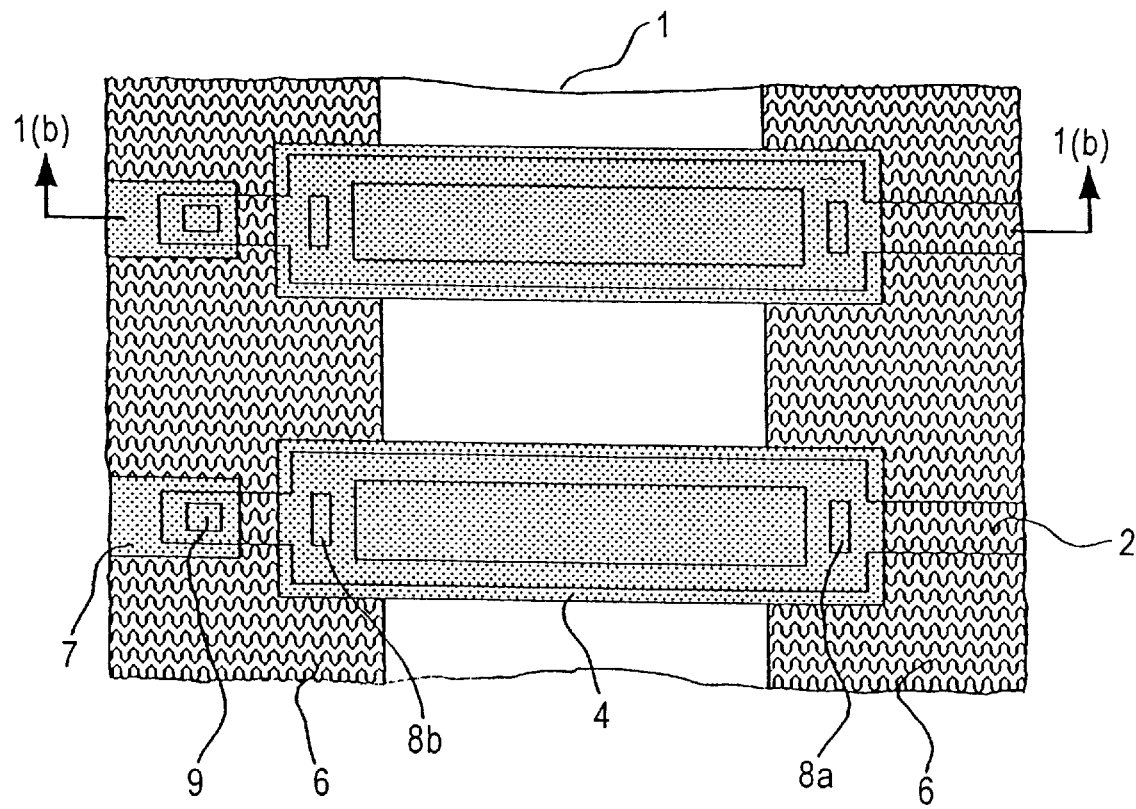
FIGS. 1(*a*) and (*b*) are a partially top view and a partially sectional view respectively showing a terminal region of a TFT array substrate according to example 1 of the present invention.
Figure 1B:
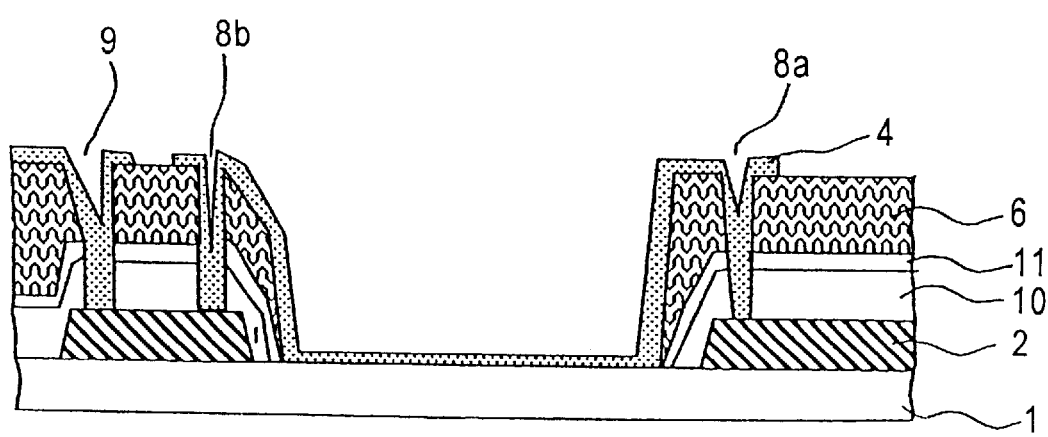

An example of the present invention is hereinafter described with reference to the drawings. FIG. 1 (*a*) is a partially top view showing a terminal region of a TFT array substrate according to example 1 of the present invention, and FIG. 1 (*b*) is a partially sectional view taken along the line A—A in FIG. 1 (*a*). In the drawings, reference numeral 1 indicates a glass substrate being a transparent insulating substrate, and numeral 2 indicates a plurality of gate lines formed on the glass substrate 1 and provided with a gate electrode. A plurality of source lines (not shown) are formed crossing over the gate liens 2. Numeral 4 is a gate terminal electrically connected to the gate liens 2. The gate terminals 4 and source terminals (not shown) electrically connected to the source lines are arranged in the periphery of an image display section of the glass substrate 1 to form a terminal region in which those terminals and external terminals are connected. Numeral 6 is an interlayer insulating film composed of an acrylic transparent resin being a photosensitive resin, and numeral 7 is a guard resistance connected to a short ring which electrically connects each terminal. Numerals 8*a* and 8*b* are contact holes of the gate terminal section, numeral 9 is a contact hole of the guard resistance section, numeral 10 is a gate insulating film, and numeral 11 is a passivation film, respectively.

In the TFT array substrate according to this example, a TFT is formed of a semiconductor layer (not shown) provided on the gate electrode disposed on the gate lines 2 formed on the glass substrate 1 through the gate insulating film 10, and of the source electrode and drain electrode (both not shown) connected to the semiconductor layer. The interlayer insulating film of which surface is flattened is provided so as not to produce any step due to the TFT, and further on the interlayer insulating film 6, a picture element electrode composed of a transparent conductive film connected to the drain electrode through the contact holes formed on the interlayer insulating film 6 is provided in a wide spread manner. As shown in FIG. 1 (*b*), the gate terminal 4 and the guard resistance 7 are electrically connected to the gate lines 2 through the contact holes 8a, 8b and 9.

A manufacturing method of the TFT array substrate according to this example is here in after described. First, a metal film such as Cr is formed to be about 400 nm on the glass substrate 1 by sputtering or the like, and the gate lines 2 provided with the gate electrode are formed by photomechanical process. Then, the gate insulating film 10 composed of silicon nitride is formed to be about 400 nm, an amorphous silicon (hereinafter referred to as a-Si) film is formed to be about 120 nm and n$^+$ type amorphous silicon (n$^+$-a-Si) film is formed to be about 30 nm, in order by plasma CVD or the like. And a-Si film to serve as a semiconductor layer of the TFT section, and n$^+$-a-Si film to serve as an ohmic contact layer are formed by photomechanical process.

Then a metal film such as Cr from which a n$^+$-a-Si layer and an ohmic contact can be taken is formed to be about 400 nm by sputtering, and the source lines provided with the source electrode and the drain electrode are formed by photomechanical process. Subsequently, the n$^+$-a-Si film on the semiconductor layer is selectively etched by dry etching to form a channel section, then the resist is removed. The foregoing is the first step.

Then, to protect the TFT, a silicon nitride film is formed to be about 100 nm on the entire surface by plasma CVD or the like, whereby a passivation film 11 is formed.

Further, in the second step, the interlayer insulating film 6 is formed by applying and baking a photosensitive acrylic transparent resin using spin coating or the like so that the surface is flattened without any step due to the TFT. In this example, the interlayer insulating film 6 is formed not only on the image display section, but also at least on the opposite end of the image display section side of each terminal in the terminal region. That is, the interlayer insulating film 6 is formed from the guard resistance 7 side to the peripheral edge portion of the substrate including the guard resistance 7 and the short ring (see FIG. 9) for preventing electrostatic destruction of the TFT at the time of manufacture.

Then, in the third step, the contact holes (not shown) of the drain electrode section of the TFT, the contact holes (8a and 8b of the gate terminal section in FIG. 1) of each terminal section, and the contact hole 9 of the guard resistance section are simultaneously formed respectively by photomechanical process and dry etching.

Finally, in the fourth step, an ITO being a transparent conductive film is formed to be about 100 nm by sputtering or the like, and the picture element electrode, respective terminals such as gate terminal 4, source terminal, and the guard resistance 7 are formed through resist patterning by photomechanical process and etching.

In the TFT array substrate obtained in the mentioned manner, as the short ring is finally separated by cutting the substrate, the interlayer insulating film 6 is provided on the periphery portion of the substrate including the end portion of the guard resistance 7 side of each terminal in the terminal region.

In the manufacturing method of the TFT array substrate according to this example, since the contact holes 8a, 8b of the gate terminal section and the contact hole 9 of the guard resistance section are simultaneously formed at the time of forming the contact hole of the drain electrode section in the image display section on the interlayer insulating film 6, the separate photomechanical process conventionally required for forming the contact hole 8b on the guard resistance 7 side of the gate terminal and the contact hole 9 of the guard resistant section is no more necessary. Thus, number of manufacturing processes can be reduce. Further, since tile photosensitive resin is used as the interlayer Insulating film 6, no step of removing the resist is required after the application of resist and etching, whereby number of manufacturing processes is further reduced. Furthermore, as the interlayer insulating film 6 is provided also on the periphery portion of the substrate including the short ring from the end of the guard resistance 7 side of each terminal, an advantage is achieved such that at the time of cutting and chambering the substrate in which the short ring is finally cut out, lase metal film can be protected.

Example 2

Figure 2A:
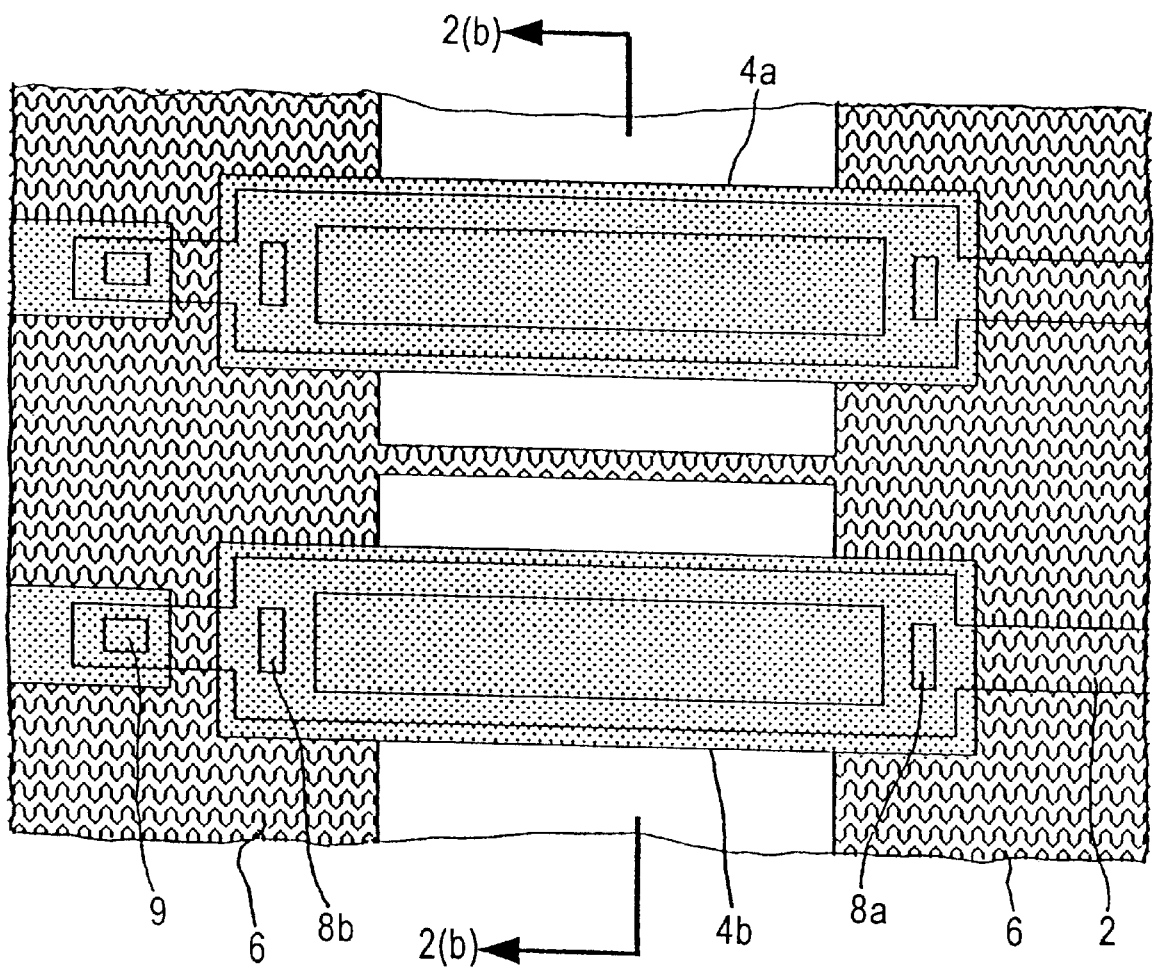
FIGS. 2(*a*) and (*b*) are a partially top view and a partially sectional view respectively showing a terminal region of a TFT array substrate according to example 2 of the invention.
Figure 2B:
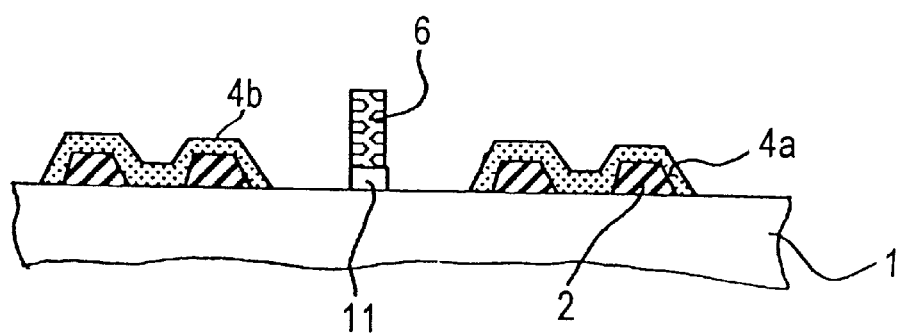

FIG. 2 (a) is a partially top view showing the terminal region of the TFT array substrate, and FIG. 2 (b) is a partially sectional view taken along the line A—A in FIG. 2 (a) according to example 2 of the invention. In the drawings, reference numerals 4a and 4b indicate the gate terminals. In the drawings, same reference numerals are designated to the same or like parts and further description is omitted herein. Further, the manufacturing method of the TFT array in this example is same as that in the foregoing example 1, and further description thereof is also omitted herein.

In this example, the interlayer insulating film 6 composed of a photosensitive resin is provided also on the periphery portion of the substrate, including the guard resistance 7 for preventing electrostatic destruction of the TFT at the time of manufacture and the short ring, from the end of the guard resistance 7 side of each terminal. And the interlayer insulating film 6 is further provided between respective terminals (between the gate terminals 4a and 4b in FIG. 2) so that width of the interlayer insulating film 6 is smaller than the distance between the terminals. As a result, in the same manner as the foregoing example 1, number of manufacturing processes can be reduced as compared with the prior arts. Furthermore, since the interlayer insulating film 6 is also formed between respective terminals, even if an etching is performed on the etching condition applied to the ITO formed on the interlayer insulating film 6, there remains no ITO between the terminals, and pattern formation of the ITO can be achieved by just one resist pattern formation and etching. Consequently, it becomes possible to prevent occurrence of deficient leak.

Example 3

Figure 3:
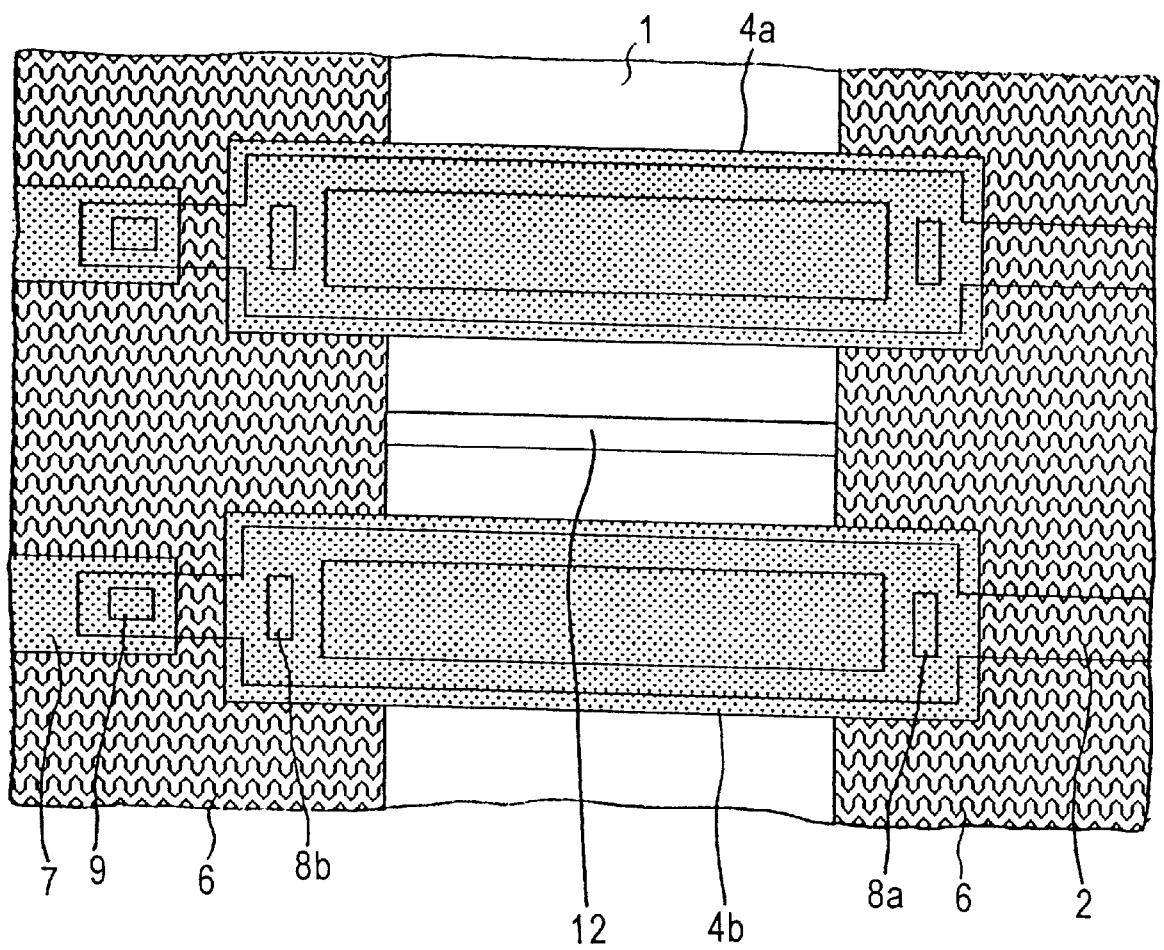
FIG. 3 is a partially top view showing a terminal region of a TFT array substrate according to example 3 of the invention.

FIG. 3 is a partially top view showing a terminal region of a TFT array substrate according to example 3 of the invention. In the drawing, reference numeral 12 indicates a thick insulating film. This is a thick insulating film of which section is not tapered and which is provided between respective terminals in such a manner as to have a smaller width than a distance between the terminals. In the drawing, same reference numerals are designated to the same or like parts and further description is omitted herein.

The manufacturing method of the TFT array according to this example is same as that according to example 1, except that the thick insulating film 12 is formed before forming an ITO for forming the picture element electrode, the gate terminals 4a, 4b and the guard resistance 7. In addition, the TFT array substrate according to this example is manufactured using six masks, and of which structure is different a little from that of the TFT array substrate manufactured by five masks as shown in the foregoing examples 1 and 2. As a result, the thick insulating film 12 can be formed without any additional manufacturing step.

In this example, the interlayer insulating film 6 composed of a photosensitive resin is formed from the end of the guard resistance 7 side to the peripheral edge portion of the substrate including the guard resistance 7 and the short ring for preventing electrostatic destruction of the TFT at the time of manufacture. Further, the thick insulating film 12 being an insulating film of which section is not tapered is provided, before forming the ITO being a transparent conductive film, between respective terminals (i.e. between the terminals 4a and 4b in FIG. 3) in such a manner as to have a smaller width than the list ance between the terminals. As a result, in the same manner as the foregoing example 1, number of manufacturing processes can be reduced as compared with the prior art. Further, as there is a sharp step of the thick insulating film 12 of which section is not tapered between respective terminals, coverage of the ITO becomes poor and therefore occurrence of deficient leak can be prevented. Furthermore, pattern formation of the ITO can be achieved by just one resist pattern formation and etching.

Example 4

Figure 4A:
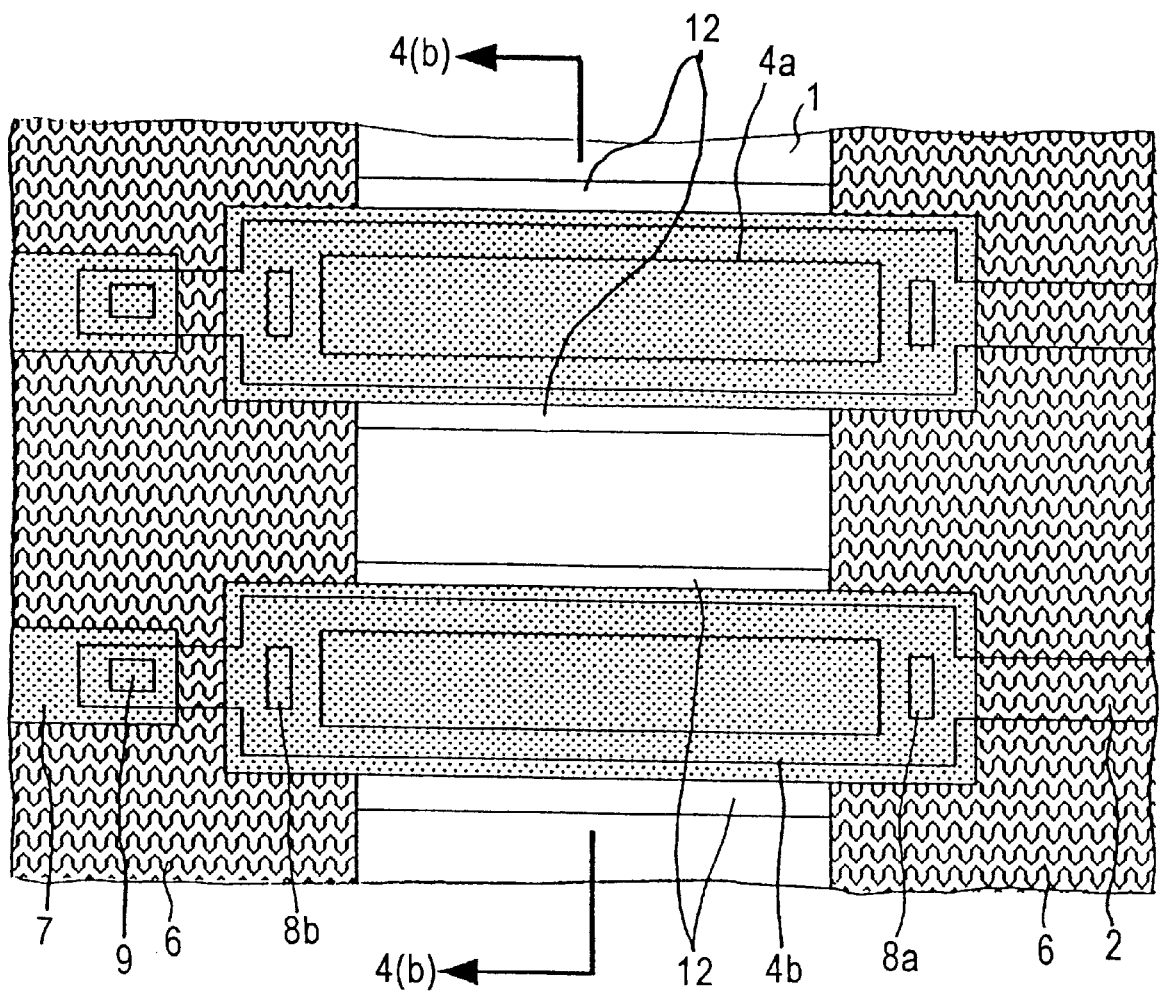
FIGS. 4 (*a*) and (*b*) are a partially top view and a partially sectional view respectively showing a terminal region of a TFT array substrate according to example 4 of the invention.

FIG. 4(a) is a partially top view showing a terminal region of a TFT array substrate according to example 4 of the invention and FIG. 4 (b) is a partially sectional view along the line A—A in FIG. 4 (a). In the drawing, same reference numerals are designated to the same or like parts and further description is omitted herein. As the manufacturing method of the TFT array substrate according to this example is same as the foregoing example 3,further description is omitted herein.

Figure 4B:
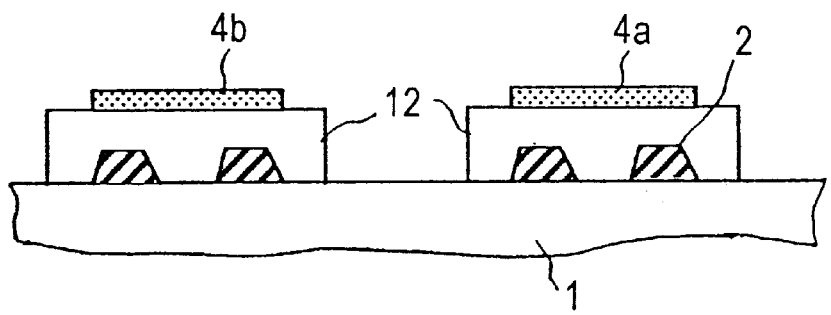

In this example, the interlayer insulating film 6 composed of a photosensitive resin is formed from the end of the guard resistance 7 side to the peripheral edge portion of the substrate including the guard resistance 7 and the short ring for preventing electrostatic destruction of the TFT at the time of manufacture. Further, the thick insulating film 12 being an insulating film of which section is not tapered is provided, before forming the ITO being ia transparent conductive film, on the lower layer of respective terminals (i.e., the terminals 4a and 4b in FIG. 4) in such a manner as to have a larger width than that of the terminals. As a result, in the same manner as the foregoing example 1,number of manufacturing processes can be reduced as compared with the prior art. Further, as there is a sharp step of the thick insulating film 12 of which section is not tapered between respective terminals as shown in FIG. 4(b), coverage of the ITO becomes poor and therefore occurrence of deficient leak can be prevented. Furthermore, pattern formation of the ITO can be achieved by just one resist pattern formation and etching.

Example 5

Figure 5A:
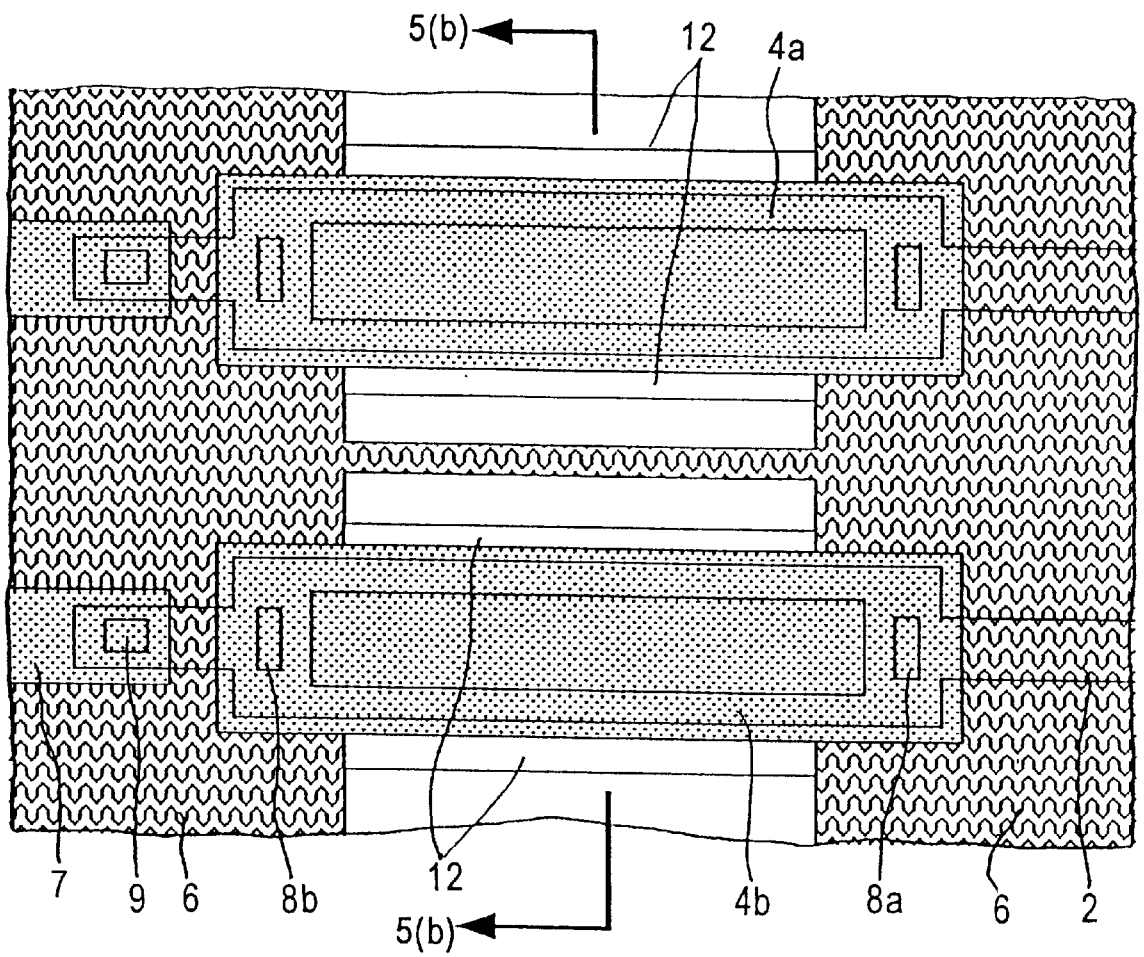
FIGS. 5(*a*) and (*b*) are a partially top view and a partially sectional view respectively showing a terminal region of a TFT array substrate according to example 5 of the invention.
Figure 5B:
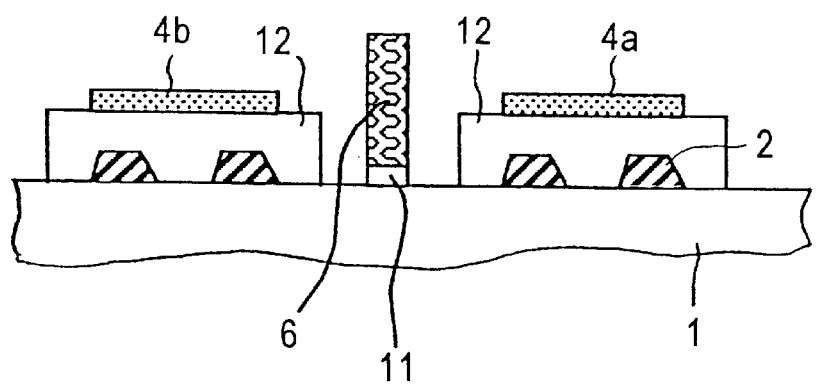

FIG. 5 (a) is a partially top view showing a terminal region of a TFT array substrate according to example 5 of the invention and FIG. 5(b) is a partially sectional view along the line A—A in FIG. 5(a). In the drawing, same reference numerals are designated to the same or like parts and further description is omitted herein. As the manufacturing method of the TFT array substrate according to this example is same as the foregoing example 3, further description is omitted herein. this example is a combination of the foregoing examples 2 and 4. In this example, the interlayer insulating film 6 composed of a photosensitive resin is formed from the end of the guard resistance 7 side not only to the peripheral edge portion of the substrate including the guard resistance 7 and the short ring for preventing electro-static destruction of the TFT at the time of manufacture but also between respective terminals (i.e., between the gate terminals 4a and 4b in FIG. 5) in such a manner as to have a smaller width than the distance between the terminals, and furthermore the thick insulating film 12 being an insulating film of which section is not tapered is provided, before forming the ITO being a transparent conductive film, on the lower layer of respective terminals (i.e., the terminals 4a and 4b in FIG. 5) in such a manner as to have a larger width than that of the terminals. As a result, the same advantage as the foregoing example 4 is achieved. Moreover, since the interlayer insulating film 6 is formed also between respective terminals, there remains no ITO between the terminals even if an etching is performed on the etching condition applied to the ITO formed on the interlayer insulating film 6, and therefore occurrence of deficient leak can be prevented all the more.

Example 6

Figure 6A:
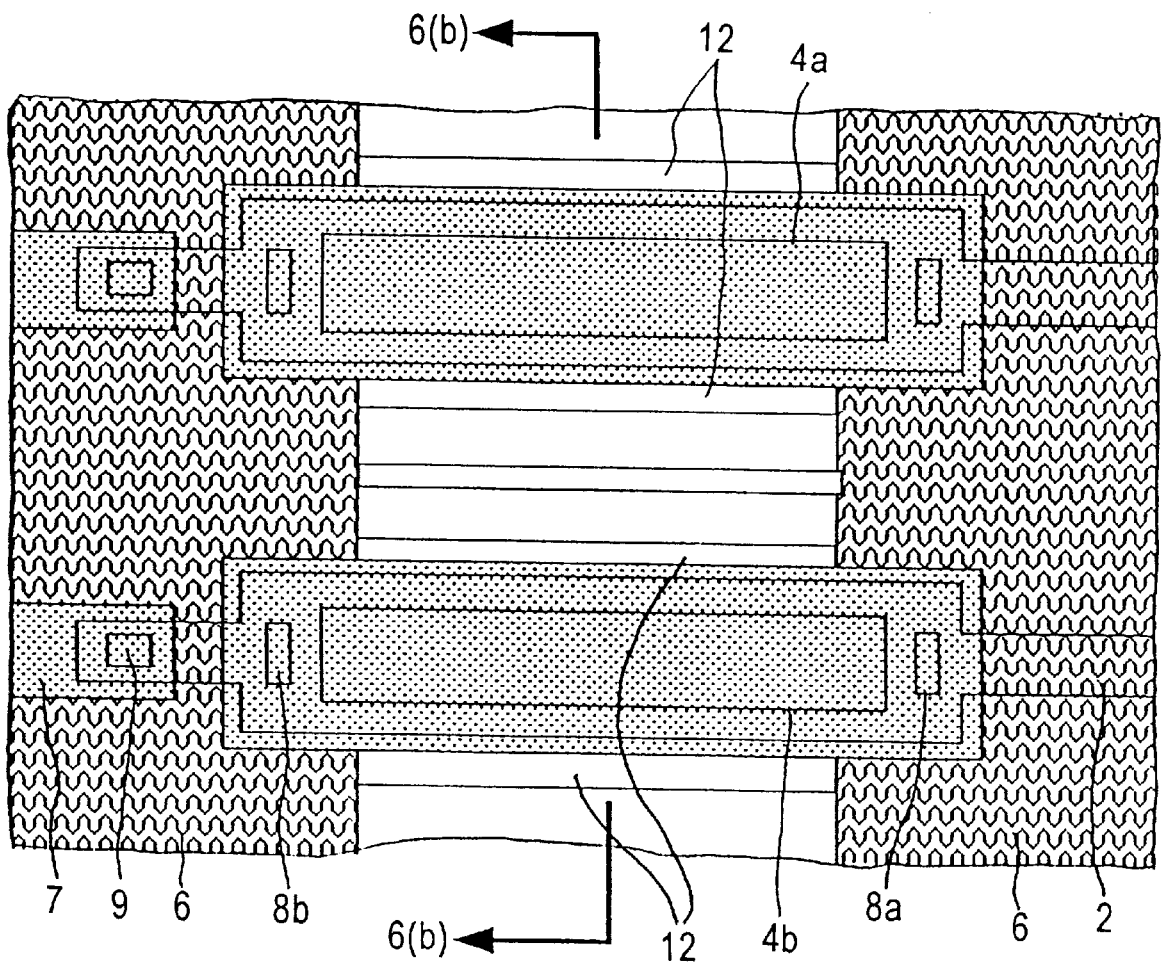
FIGS. 6(*a*) and (*b*) are a partially top view and a partially sectional view respectively showing a terminal region of a TFT array substrate according to example 6 of the invention.
Figure 6B:
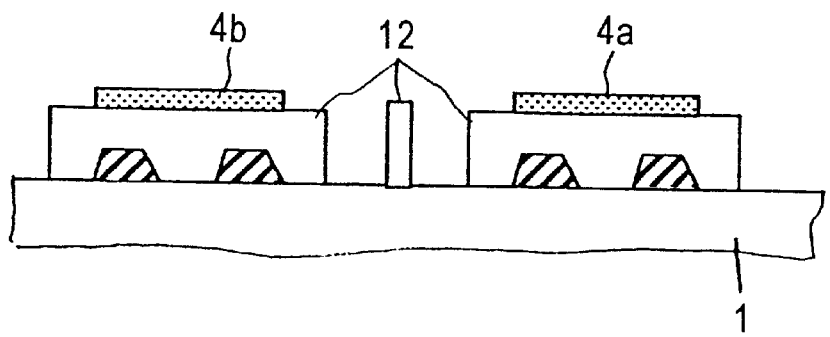

FIG. 6 (a) is a partially top view showing a terminal region of a TFT array substrate according to example 6 of the invention, and FIG. 6 (b) is a partially sectional view along the line A—A in FIG. 6 (a). In the drawing, same reference numerals are designated to the same or like parts and further description is omitted herein. As the manufacturing method of the TFT array substrate according to this example is same as the foregoing example 3, further description is omitted herein.

This example is a combination of the foregoing examples 3 and 4. In this example, the interlayer insulating film 6 composed of a photosensitive resin is formed from the end of the guard resistance 7 side of each terminal in the terminal region to the peripheral edge portion of the substrate including the guard resistance 7 and the short ring for preventing electrostatic destruction of the TFT at the time of manufacture, and furthermore the thick insulating film 12 being an insulating film of which section is not tapered is provided, before forming the ITO being a transparent conductive film, between respective terminals (i.e., the terminals 4a and 4b in FIG. 6) in the terminal region in such a manner as to have a smaller width than the distance between the terminals, and on the lower layer of each terminal in such a manner as to have a lager width than that of the terminals. As a result, the same advantage as the foregoing example 4 is achieved. Moreover, since a plurality of sharp thick insulating film 12 of which section is not tapered are provided between respective terminals, coverage of ITO becomes poor, and therefore occurrence of deficient leak can be prevented all the more.

Example 7

Figure 7:
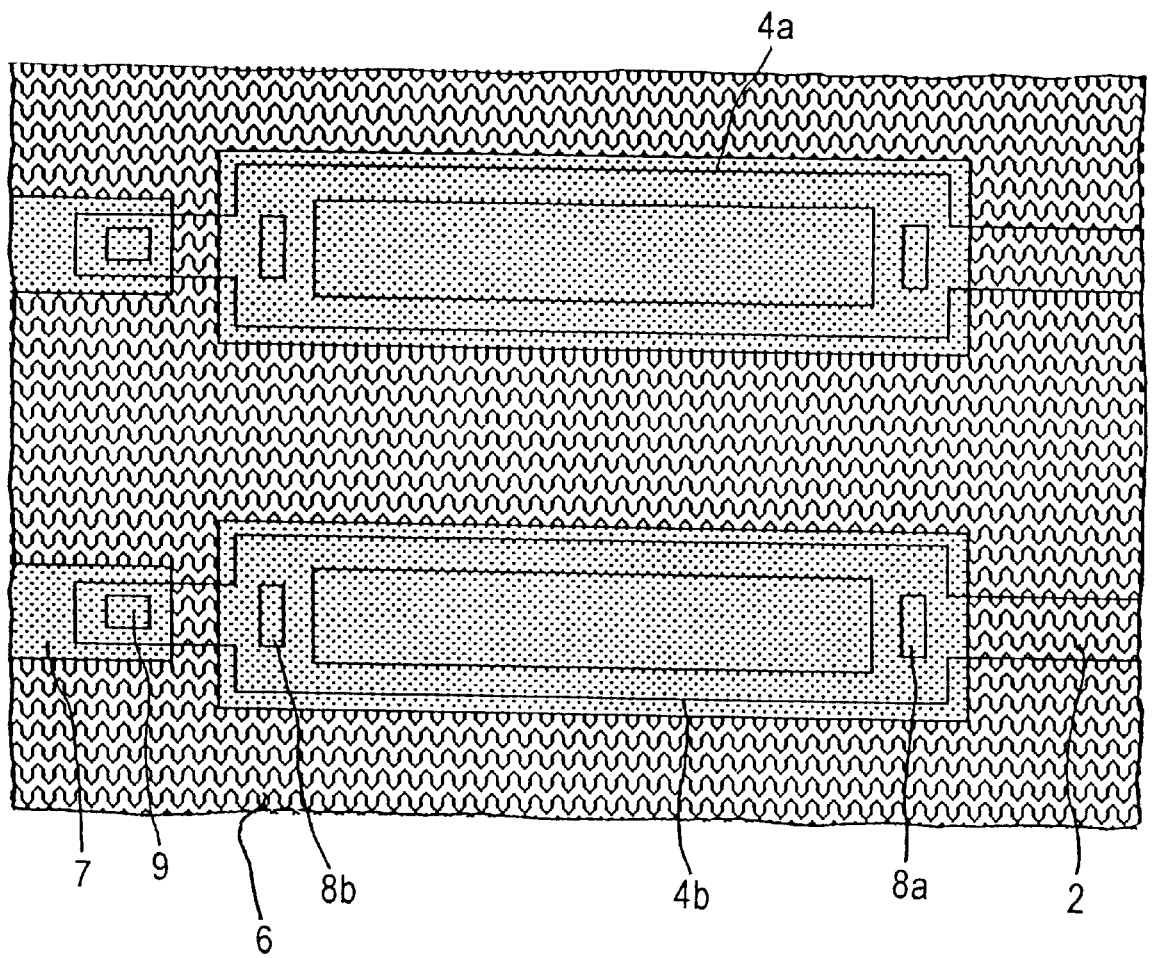
FIG. 7 is a partially top view showing a terminal region of a TFT array substrate according to example 7 of the invention.

FIG. 7 is a partially top view showing a terminal region of a TFT array substrate according to example 7 of the invention. In the drawing, same reference numerals are designated to the same or like parts and further description is omitted herein. As the manufacturing method of the TFT array substrate according to this example is same as the foregoing example 1, further description is omitted herein.

In this example, the photosensitive interlayer insulating film 6 is also formed on the entire terminal region and on the peripheral edge portion of the substrate including the guard resistance 7 and the short ring for preventing electrostatic destruction of the TFT at the time of manufacture. As a result, in the same manner as the foregoing example 1, number of processes can be reduced as compared with the prior arts, and furthermore since the interlayer insulating film 6 is formed between respective terminals, even if an etching is performed on the etching condition applied to the ITO formed on the interlayer insulating film 6, there remains no ITO between the terminals, and pattern formation of the ITO can be achieved by just one resist pattern formation and etching. Consequently, it becomes possible to prevent occurrence of deficient leak. It is to be noted, however, that in this example since the foundation applied to the ITO being an upper conductive film of the terminal is the interlayer insulating film 6, the foregoing examples 1 to 6 in which there is no interlayer insulating film 6 in most of the foundation of the terminal are superior to this example 7 in the aspect of close contact force between the upper conductive film of the terminal and the foundation.

Example 8

Figure 8A:
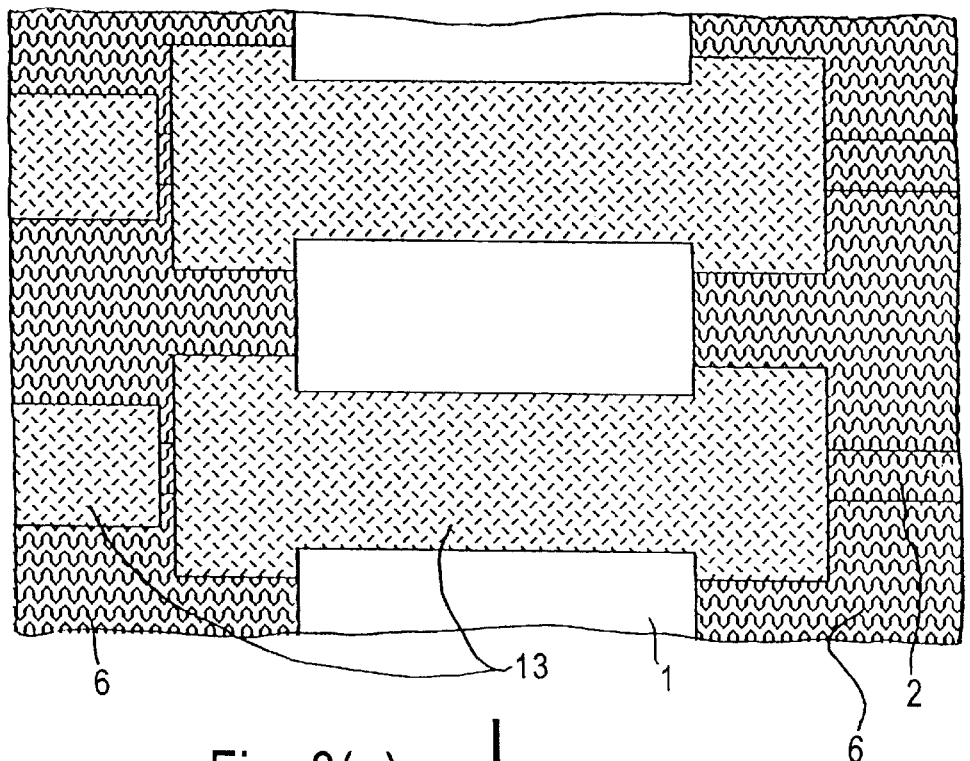
FIG. 8 is a partially top view showing a manufacturing method of a TFT array substrate according to example 8 of the invention.
Figure 8B:
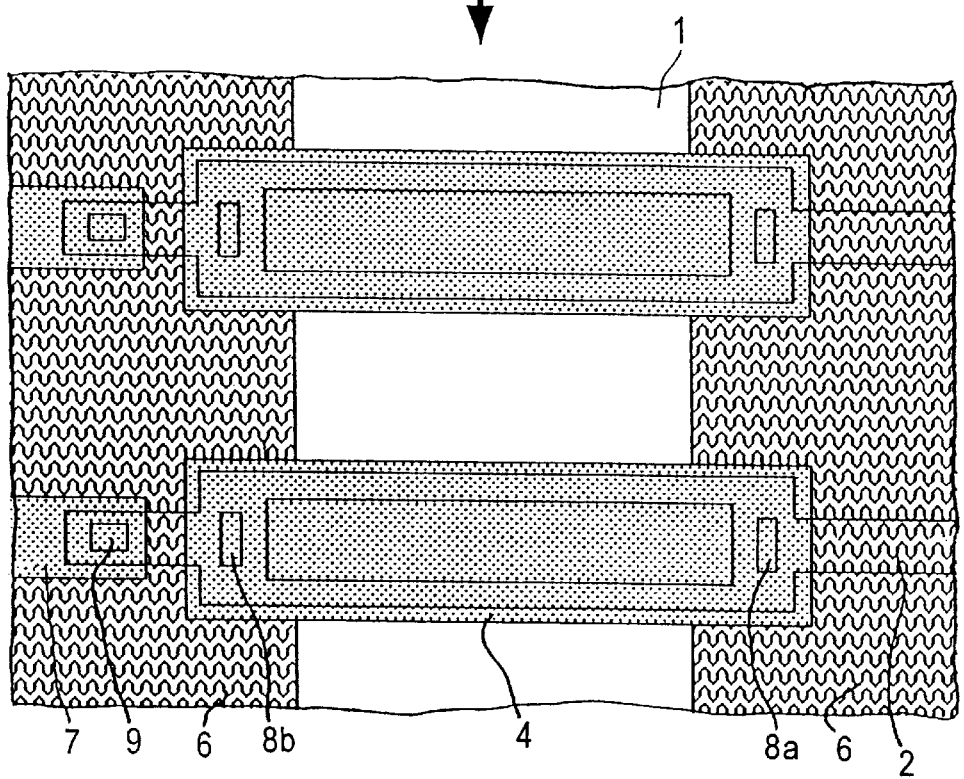

FIG. 8 is a partially top view showing a terminal region of a TFT array substrate according to example 8 of the invention. In the drawing, reference numeral 13 indicates a resist pattern. In the drawing, same reference numerals are designated to the same or like parts and further description is omitted herein.

In this example, in the fourth step described in the foregoing example 1, i.e., in the step of forming an ITO being a transparent conductive film on the substrate on which TFT and the interlayer insulating film 6 are formed, and forming the picture element electrode, each terminal and the guard resistance 7 by resist patterning and etching, as shown in FIG. 8(a), the resist pattern 13 of each terminal was formed on the interlayer insulating film 6 composed of an organic film such as photosensitive acrylic transparent resin in such a manner as to have a larger width than a desired pattern, and an etching was performed on the etching condition (time) applied to the ITO formed on the glass substrate 1 or on the inorganic film, whereby a desired pattern was obtained. Because etching speed of the ITO formed on the interlayer insulating film 6 being an organic film is higher than that of the ITO formed on the glass substrate 1 or on the inorganic film, when an etching is performed at the etching time applied to the latter, the ITO on the interlayer insulating film 6 is excessively etched. Considering such excessive etching, in this example, the resist pattern 13 on the interlayer insulating film 6 is formed to have a lager width, and as a result a desired pattern can be formed. Except this, the TFT array substrate is prepared in the same manufacturing method as the foregoing example 1.

In this example, in the same manner as the foregoing example 1, number of processes can be reduced as compared with the prior arts. Furthermore, since the etching is performed at the etching time applied to the ITO formed on the glass substrate 1 or on the inorganic film, there remains no ITO etching residue between the terminals, and occurrence of deficient leak can be prevented. It is also possible to perform the pattern formation of the ITO by just one resist pattern formation and etching.

Though Cr is used as gate electrode and as source electrode and drain electrode in the foregoing examples 1 to 8, it is also preferable to use other material such as Al, Cu, Mo or Ta. By using these materials, it is possible to achieve an electrode and wiring of low resistance of which specific resistance value is 25 $\mu\Omega$·cm. The gate electrode, the source electrode and the drain electrode are not always composed of the same metallic material, but these electrodes can be formed in combination of different metals chosen from the mentioned metallic materials. To serve as the picture element electrode, any other transparent conductive film such as film of indium oxide, tin oxide, zinc oxide or other metal can be used other than ITO. Though a-Si film is used as the semiconductor layer, the semiconductor layer is not limited to this material and any other film such as polycrystalline Si film can be used. Though the passivation film 11 for protecting the TFT is formed of a silicon nitride film, it is not always necessary to form the passivation film 11. Though the gate terminals 4, 4a and 4b are shown as each terminal in the terminal region in FIGS. 1 to 8, the same advantage can be achieved also in the source terminal of the invention.

It is to be noted that in the liquid crystal display according to the invention, a liquid crystal is arranged between the TFT array substrate according to any of the foregoing examples 1 to 8 and the opposite electrode substrate having a transparent electrode, color filter, etc. Therefore, the TFT array substrate according to the invention can be suitable not only for the transparent type liquid crystal display but also for the reflection type liquid crystal display. In the case of reflection type liquid crystal display, it is not necessary that the interlayer insulating film 6 is transparent.

Example 9

Figure 9:
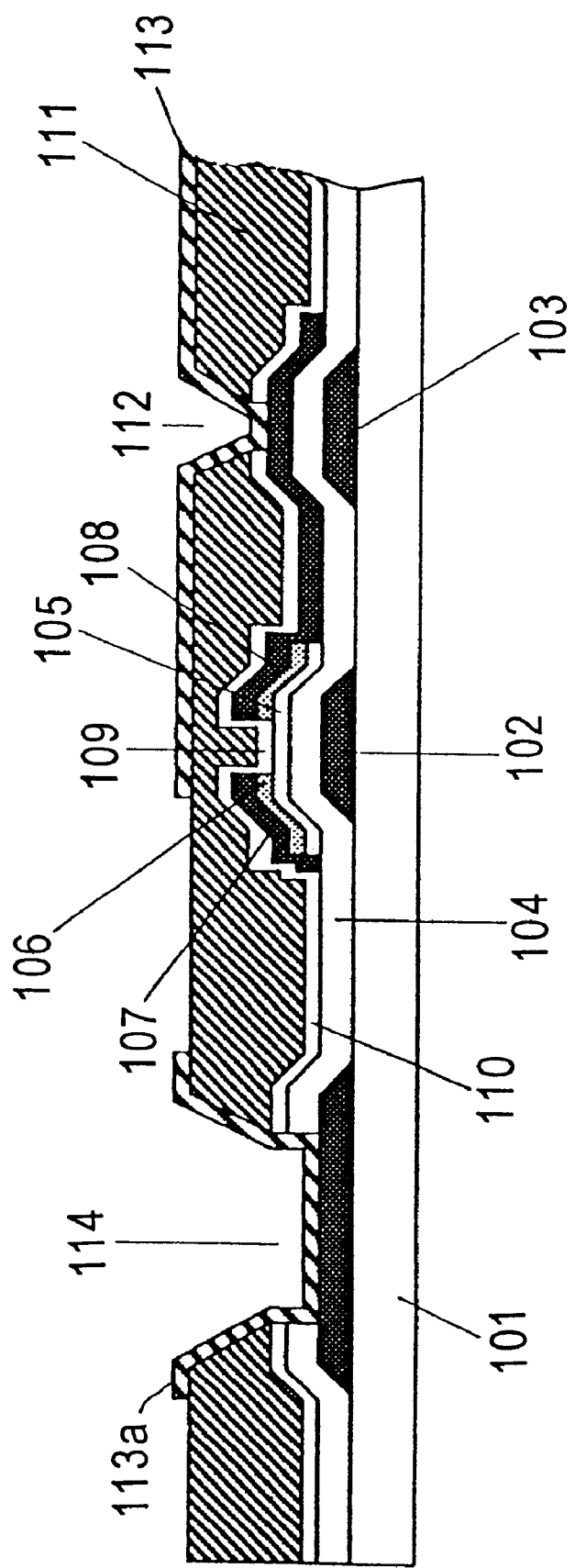
FIG. 9 is a sectional view showing the TFT array substrate of a liquid crystal display as defined in example 9 of the invention.
Figure 10:
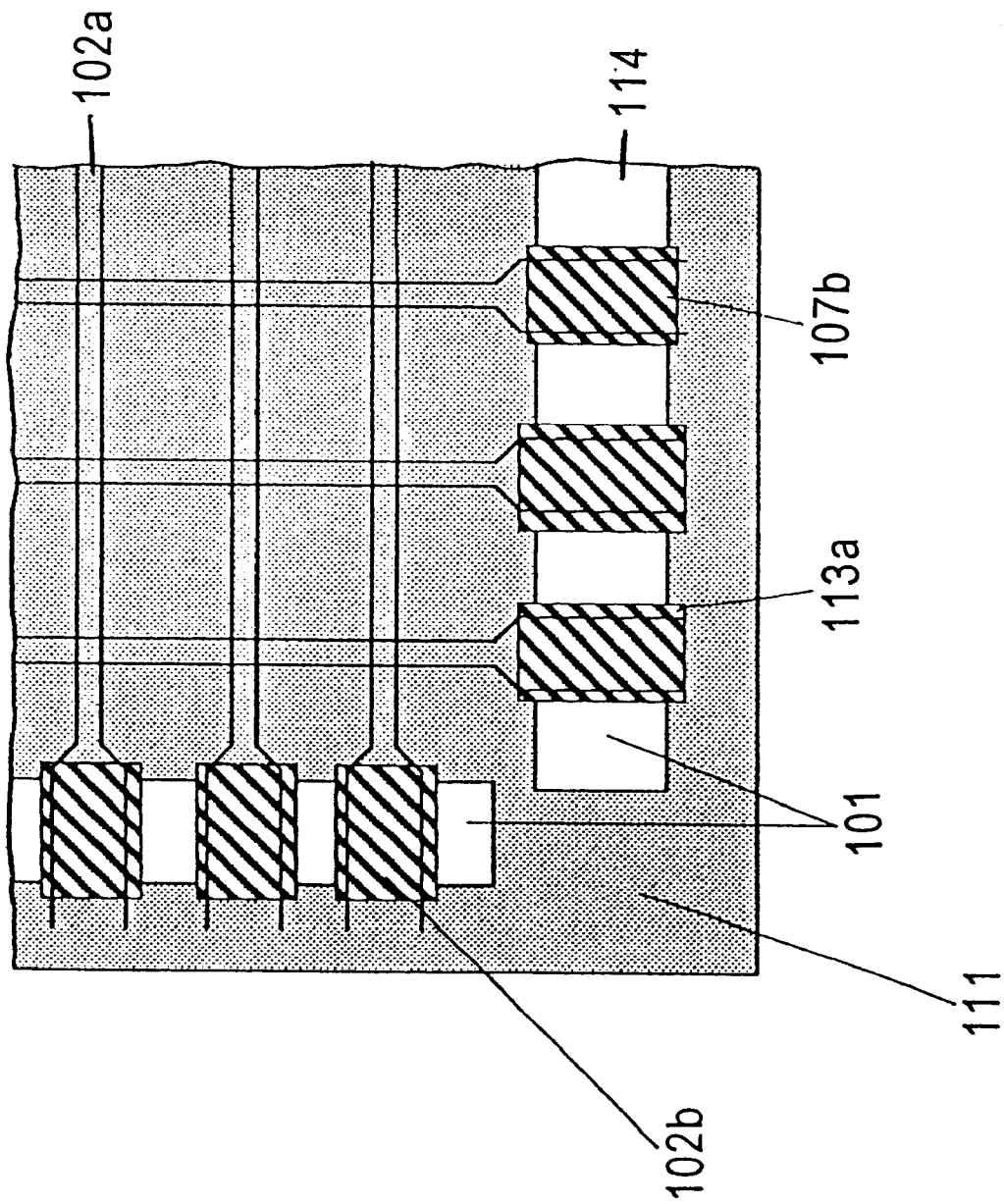
FIG. 10 is a schematic plan view showing a peripheral section of the TFT array substrate of a liquid crystal display as defined in example 9 of the invention.
Figure 11:
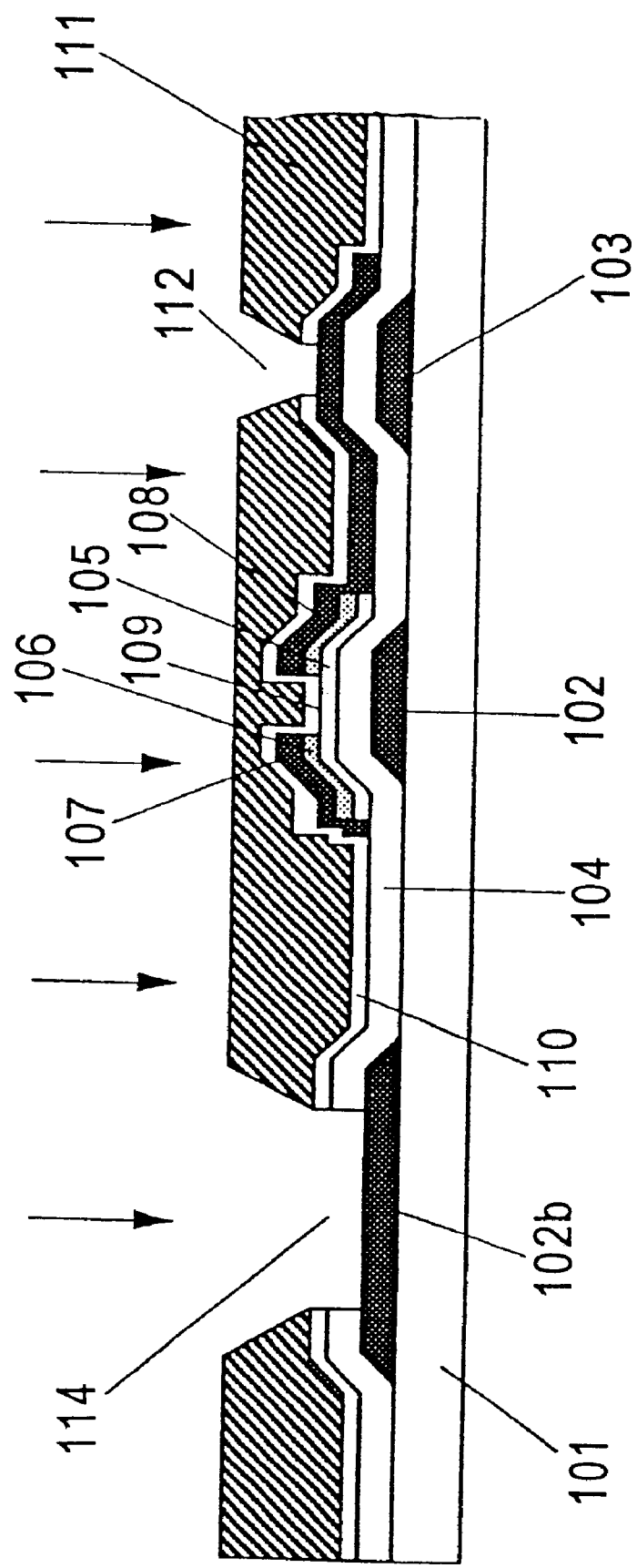
FIG. 11 is a sectional view showing a manufacturing step of the TFT array substrate of the liquid crystal display as defined in example 9 of the invention.

A manufacturing method of a liquid crystal display according to one example of the invention is hereinafter described. FIG. 9 is a sectional view showing the TFT array substrate of a liquid crystal display on which a TFT is mounted to serve as a switching element according to example 9 of the invention. FIG. 10 is a schematic plan view showing a peripheral section of the TFT array substrate shown in FIG. 9. FIG. 11 is a sectional view showing a manufacturing step of the TFT array substrate shown in FIG. 9.

In the drawings, reference numeral 101 indicates a transparent insulating substrate such as glass substrate, and numeral 102 indicates a scanning electrode (gate electrode in this example) formed on the transparent insulating substrate 101. Numeral 102a indicates a scanning electrode line (gate electrode line in this example) having the scanning electrode 102, and numeral 102b is a scanning electrode line terminal (gate terminal in this example) formed by extending from the scanning electrode line 102a. Numeral 103 is a common electrode formed on the transparent insulating substrate 101, and numeral 104 is a gate insulating film formed on the gate electrode line 102a and on the common electrode 103. Numeral 105 is a semiconductor layer formed on the gate electrode 102 through the gate insulating film 104, and numeral 106 is a contact layer formed on the semiconductor layer 105. Numerals 107 and 108 are a first electrode and a second electrode (source electrode and drain electrode in this example) formed on the contact layer 106. Numeral 107a is a first electrode line (source electrode line in this example) having the first electrode 107, and numeral 107b is a first electrode line terminal (source terminal in this example) formed by extending from the first electrode line 107. Numeral 109 is a channel section, numeral 110 is a passivation film, and numeral 111 is an interlayer insulating film formed on the passivation film 110. Numeral 112 is a contact hole formed in the passivation film 110 and in the interlayer insulating film, and numeral 113 is a picture element electrode formed on the interlayer insulating film 111. This picture element electrode 113 is electrically connected to the drain electrode 108 through the contact hole 112 formed in the passivation film 110 and in the interlayer insulating film 111. Numeral 113a is an ITO film on the terminals 102b and 107b formed simultaneously with the picture element electrode 113, and numeral 114 is an assembly region in which the terminals 102b and 107b are disposed. In this assembly region 114, the gate insulating film 104, the passivation film 110 and the interlayer insulating film 111 are removed, and the transparent insulating substrate 101 is exposed between respective terminals 102b and 107b.

Manufacturing steps of the TFT array substrate of the liquid crystal display according to this example is hereinafter described. First, a Cr film is formed on the surface of the transparent insulating substrate 101 by sputtering, etc., and formation of resist by photomechanical process and patterning by wet etching are performed, whereby the gate electrode 102, the gate electrode line 102a, the gate terminal 102b and the common line 103 are formed.

Then, after forming by plasma CVD a silicon nitride film, an amorphous silicon film and an amorphous silicon film of low resistance doped with an impurity all forming the gate insulating film 104 in order, formation of resist by photomechanical process and patterning by dry etching are performed, whereby the semiconductor layer 105 and the contact layer 106 are formed.

Then, a Cr film is formed by sputtering, and formation of resist by photomechanical process and patterning by wet etching are performed, whereby the source electrode 107, the source electrode line 107a, the source terminal 107b and the drain electrode 108 are formed. Thereafter, the amorphous silicon film (contact layer 106) of low resistance not coated with the source electrode 107 and the drain electrode 108 is etched by dry etching, thus the channel section 109 is formed, whereby a TFT is formed.

Then, to protect the TFT, a silicon nitride film to be the passivation film 110 is formed by plasma CVD.

Then, to flatten the surface by assimilating the step produced due to the TFT and the electrode line, a photosensitive acrylic transparent resin is applied by spin coating, and after forming the contact hole by exposure and development, the interlayer insulating film 111 is formed by breaching exposure and baking. At this time, as shown in FIG. 10, in the assembly region in which the gate terminal 102b and the source terminal 107b for electrically connecting the gate electrode line 102a or the source electrode line 107a to an external substrate (not shown) are arranged, the interlayer insulating film 111 is removed so as not to remain on each terminal 102b, 107b and between respective terminals 102b and 107b. The interlayer insulating film 111 between respective terminals 102b and 107b are removed from the viewpoint of preventing increase of connection resistance of each terminal 102b, 107b and the external substrate due to irregularity of the interlayer insulating film 111.

Then, employing the dry etching and using the interlayer insulating film 111 as a mask, the passivation film 110 exposed due to the contact hole formed in the interlayer insulating film 111 is etched to form the contact hole 112, and the passivation film 110 and the gate insulating film 104 are etched in the assembly region 114.

At this time in the assembly region 114, the transparent insulating substrate 101 is exposed between respective terminals 102b and 107b.

FIG. 11 shows the dry etching of the passivation film 110 and the gate insulating film 104 using the interlayer insulating film 111 as the mask. Dry etching condition of the passivation film 110 and the gate insulating film 104 is as follows. After etching the silicon nitride forming the passivation film 110 and the gate insulating film 104 using $CF_4+O_2$, $SF_6+O_2$ or other fluorine gas+$O_2$, to reduce the connection resistance between the picture element electrode 113 and the drain electrode 108 formed in the next step, an ashing process is performed with $O_2$ gas, and residue on the drain electrode 108 of the bottom portion of the contact hole is removed. At this time, as the etching process using $CF_4+O_2$, $SF_6+O_2$ or other fluorine gas+$O_2$ and the ashing process $O_2$ gas are applied also to the surface of the interlayer insulating film 111, an irregularity is formed on the surface of the interlayer insulating film 111.

Then, for the purpose of reducing the irregularity on the surface of the interlayer insulating film 111 formed by the ashing process with $O_2$ gas, the etching process using $CF_4+O_2$, $SF_6+O_2$ or other fluorine gas+$O_2$ is performed again.

This second etching process using $CF_4+O_2$, $SF_6+O_2$ or other fluorine gas+$O_2$ is performed in shorter time than the first etching time to prevent sticking of the residue of the interlayer insulating film again to the contact hole 112. Otherwise, the second etching is performed while increasing flow rate of the $CF_4+O_2$, $SF_6+O_2$ or other fluorine gas+$O_2$. Otherwise, the second etching is performed while reducing the power than that in the first etching. Otherwise, the second etching is performed by combining at least the foregoing two conditions of the process in shorter time, the increase flow rate of $O_2$ gas, and the reduction in power.

Then, an ITO film is formed by sputtering, and the picture element electrode 113 is formed on the interlayer insulating film 111 the ITO film 113a is formed on respective terminals 102b and 107b by formation of a resist by photomechanical process and by etching. At this time, the picture element electrode 113 is electrically connected to the drain electrode 108 through the contact hole 112.

In the etching of the ITO film, by reducing the irregularity on the surface of the interlayer insulating film 111 by applying again the etching process using $CF_4+O_2$, $SF_6+O_2$ or other fluorine gas+$O_2$ after the ashing process with $O_2$ gas in the previous step, etching speed of the ITO film on the interlayer insulating film 111 and the ITO film on the transparent insulating substrate 101 between respective terminals 102b and 107b in the assembly region 114 becomes almost the same. Thus, the picture element electrode 113 and the ITO film 113a in the assembly region 114 can be simultaneously patterned in one etching process.

An orientation film is formed on the surface of the opposite substrate with opposite electrode formed on another transparent insulating substrate and arranged oppositely to the TFT array substrate formed in the mentioned manner, and a liquid crystal display is formed by injecting a liquid crystal material therebetween.

In the etching of the ITO film forming the picture element electrode 113, when performing the etching process employing the optimum etching time for the ITO film on the transparent insulating substrate 101, side etching amount of the ITO pattern (picture element electrode 113) on the interlayer insulating film 111 is 1 μm or less on one side, thus a pattern of desirable configuration being achieved.

Connection resistance between the picture element electrode 113 and the drain electrode 108 was several hundred Ω or less at 35 μm□.

According to this example, in the step of forming the contact hole 112 for connecting the picture element electrode 113 and the drain electrode 108 formed on the interlayer insulating film 111, after applying the etching process of the passivation film 110 and the gate insulating film 104 using $CF_4+O_2$, $SF_6+O_2$ or other fluorine gas+$O_2$ and the ashing process with $O_2$ gas to remove the residue in the contact hole 112, using the interlayer insulating film 111 as a musk, a further etching process using $CF_4+O_2$, $SF_6+O_2$, or other fluorine gas+$O_2$ is applied. As a result, irregularity on the interlayer insulating film 111 formed by ashing with $O_2$ gas can be reduced, and connection resistance between the picture element electrode 113 and the drain electrode 108 can be reduced through the contact hole 112. Furthermore, at the time of forming the picture element electrode 113, the ITO film on the interlayer insulating film 111 and the ITO film on the transparent insulating substrate 101 between respective terminals 102b and 107b in the assembly region 114 can be patterned by one etching process.

Example 10

In the foregoing example 9, the etching process of the passivation film 110 and the gate insulating film 104 using the interlayer insulating film 111 as a mask was performed first by the etching process of the passivation film 110 and the gate insulating film 104 using $CF_4+O_2$, $SF_6+O_2$ or other fluorine gas+$O_2$, then by the ashing process with $O_2$ gas to remove the residue in the contact hole 112, and by the second etching process using $CF_4+O_2$, $SF_6+O_2$ or other fluorine gas+$O_2$. On the other hand, in this example, the etching process of the passivation film 110 and the gate insulating film 104 is performed using $CF_4+O_2$, $SF_6+O_2$ or other fluorine gas+$O_2$, and the second etching process is performed by increasingflowrateof $O_2$ gas also using $CF_4+O_2$, $SF_6+O_2$, or other fluorine gas+$O_2$. As a result, connection resistance between the picture element electrode 113 and the drain electrode 108 can be reduced through the contact hole 112 by removing the residue on the bottom part of the contact hole 112, and irregularity on surface of the interlayer insulating film 111 can be reduced as compared with the ashing process with $O_2$ gas. Furthermore, at the time of forming the picture element electrode 113, etching characteristic of the ITO film on the interlayer insulating film 111 and the ITO film on the transparent insulating substrate 101 between respective terminals 102b and 107b in the assembly region 114 can be improved.

Example 11

Figure 12:
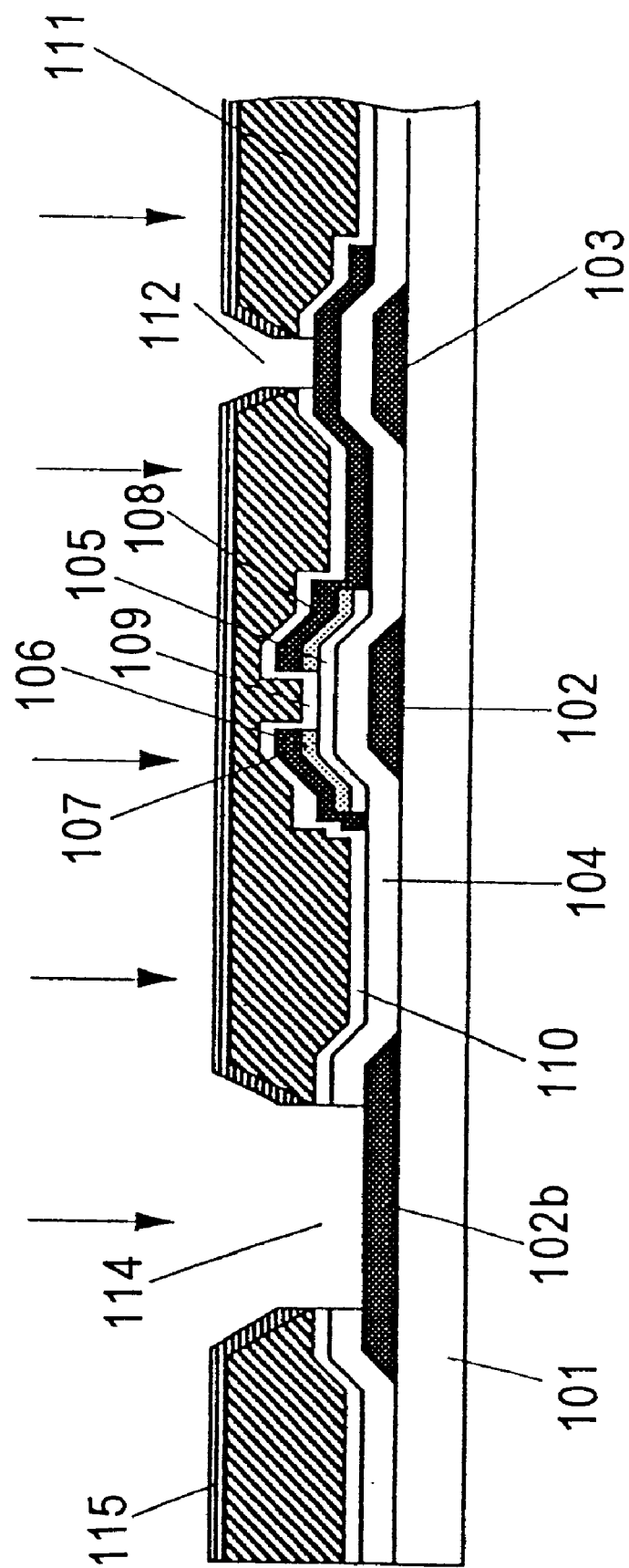
FIG. 12 is a sectional view showing a manufacturing step of the TFT array substrate of the liquid crystal display as defined in example 11 of the invention.

FIG. 12 is a sectional view showing a manufacturing step of the TFT array substrate of the liquid crystal display according to example 11 of the invention. In the drawing, reference numeral 115 indicates a resist formed on the interlayer insulating film 111. In the drawing, same reference numerals are designated to the same or like parts and further description is omitted herein.

Now, a manufacturing process of the TFT array substrate of the liquid crystal display according to this example is hereinafter described.

In the same manner as in example 9, gate electrode 102, gate electrode line (not shown), gate terminal 102b, common electrode 103, gate insulating film 104, semiconductor layer 105, contact layer 106, source electrode 107, drain electrode 108, source electrode line (not shown), source terminal (not shown), channel section 109 and passivation film 110 are formed in order on a transparent insulating substrate 101.

Then, a photosensitive acrylic transparent resin is applied by spin coating or the like, and after forming a contact hole by applying exposure and development, an interlayer insulating film 111 is formed by breaching exposure and baking. At this time, as shown in FIG. 10, in the assembly region 114 in which the gate terminal 102b and the source terminal 107b are disposed for electrically connecting the gate electrode line 102a or the source electrode line 107a to an external substrate (not shown), the interlayer insulating film 111 is removed so as not to remain on the terminals 102b and 107b and between respective terminals 102b and 107b.

Then, a photo resist is applied on the interlayer insulating film 111, and after exposing the photo resist using the mask used at the time of exposing the mentioned acrylic transparent resin, a resist 115 of the same pattern as the interlayer insulating film 111 is formed by applying a development process.

Then, using the resist 115 as a mask, the contact hole 112 is formed by etching the passivation film 110 by dry etching, and the passivation film 110 and the gate insulating film 104 in the assembly region 114 are etched.

In the dry etching process of the passivation film 110 and the gate insulating film 104, after etching a silicon nitride forming the passivation film 110 and the gate insulating film 104 using $CF_4+O_2$, $SF_6+O_2$, or other fluorine gas+$O_2$, residue on the bottom part of the contact hole 112 is removed, and to reduce the connection resistance between the picture element electrode formed in the next step and the drain electrode 108, an ashing process using $O_2$ gas is performed. The resist 115 is then removed. Note that at the time of ashing process using $O_2$ gas, as the surface of the interlayer insulating film 111 is protected by the resist 115, any irregularity is not formed on the surface of the interlayer insulating film 111.

Thereafter, an ITO film is formed on the picture element electrode and on respective terminals 102b and 107b in the same manner as in example 9, thus a TFT substrate is formed.

The same advantage can be achieved by performing the dry etching process of the passivation film 110 and the gate insulating film 104 in such a manner that after etching the silicon nitride using $CF_4+O_2$, $SF_6+O_2$ or other fluorine gas+$O_2$, to remove the residue on the bottom part of the contact hole 112, an etching process is performed using $CF_4+O_2$, $SF_6+O_2$ or other fluorine gas+$O_2$ while increasing flow rate of $O_2$ gas.

In this example, for the purpose of removing the residue on the bottom part of the contact hole 112, the ashing process using $O_2$ gas or the etching process using $CF_4+O_2$, $SF_6+O_2$ or other fluorine gas+$O_2$ while increasing flow rate of $O_2$ gas, is performed under protection of the surface of the interlayer insulating film 111 with the resist 115. As a result, any irregularity is not formed on the surface of the interlayer insulating film, and connection resistance between the picture element electrode and the drain electrode 108 can be reduced through the contact hole 112. Furthermore, at the time of forming the picture element electrode, etching speed of the ITO film on the interlayer insulating film 111 and that of the ITO film on the transparent insulating substrate 101 between respective terminals 102b and 107b in the assembly region 114 are almost the same, and the picture element electrode and the ITO film is the assembly region 114 can be patterned by one etching process.

Example 12

Figure 13:
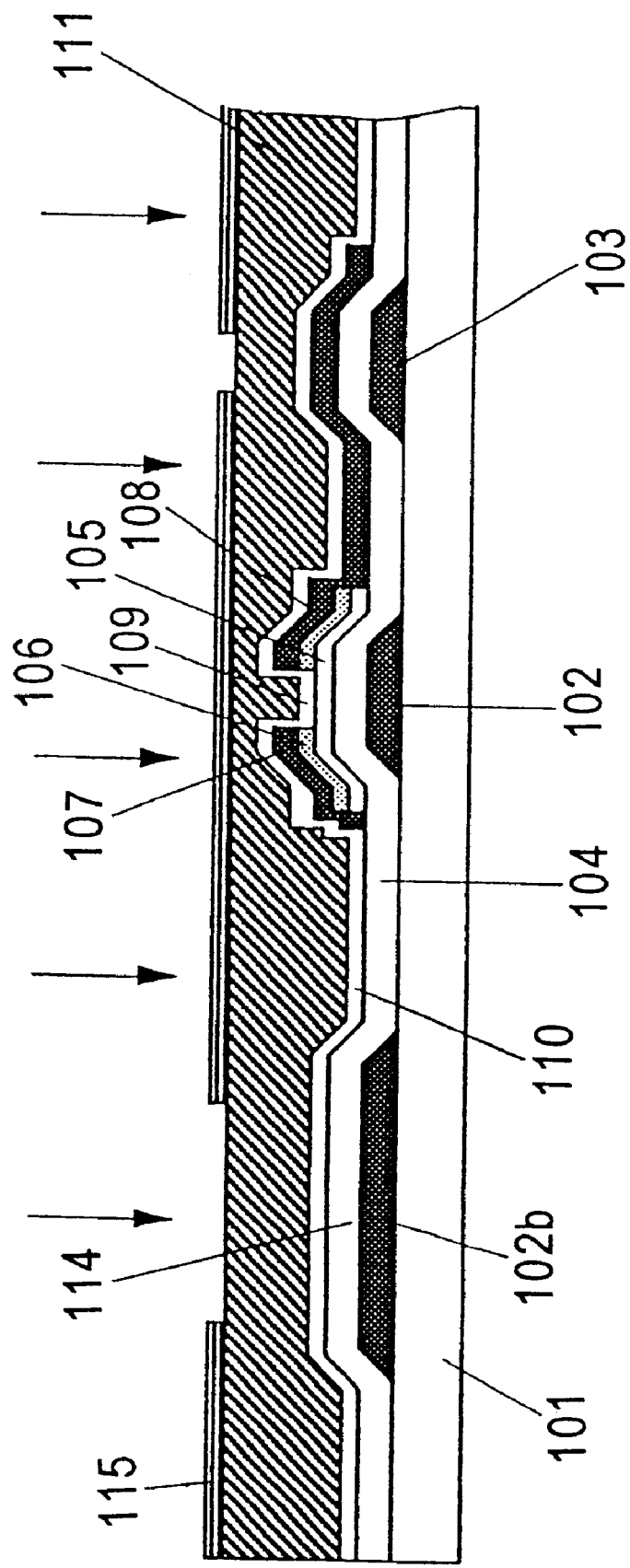
FIG. 13 is a sectional view showing a manufacturing step of the TFT array substrate of the liquid crystal display as defined in example 12 of the invention.

FIG. 13 is a sectional view showing a manufacturing step of a TFT array substrate of a liquid crystal display according to example 12 of the invention. In the drawing, same reference numerals are designated as in FIG. 12 and further description is omitted herein.

Now, a manufacturing process of the TFT array substrate of the liquid crystal display according to this example is hereinafter described.

In the same manner as example 9, gate electrode 102, gate electrode line (not shown), gate terminal 102b, common electrode 103, gate insulating film 104, semiconductor layer 105, contact layer 106, source electrode 107, drain electrode 108, source electrode line (not shown), source terminal (not shown), channel section 109 and passivation film 110 are formed in order on a transparent insulating substrate 101.

Then, an acrylic transparent resin having no photosensitivity is applied by spin coating or the like, and an interlayer insulating film 111 is formed by baking.

Then, a photo resist is applied on the interlayer insulating film, and after exposure and development, a resist 115 having an aperture pattern at a predetermined position is formed.

Then, using the resist 115 as a mask, the contact hole 112 is formed by etching the interlayer insulating film 111 and the passivation film 110 by dry etching. Then the interlayer insulating film 111, the passivation film 110 and the gate insulating film 104 in the assembly region 114 are etched.

In the dry etching process of the interlayer insulating film 111, the passivation film 110 and the gate insulating film 104, after etching a silicon nitride forming the interlayer insulating film 111, the passivation film 110 and the gate insulating film 104 using $CF_4+O_2$, $SF_6+O_2$ or other fluorine gas+$O_2$, residue on the bottom part of the contact hole 112 is removed, and to reduce the connection resistance between the picture element electrode formed in the next step and the drain electrode 108, an ashing process using $O_2$ gas is performed. The resist 115 is then removed. Note that at the time of ashing process using $O_2$ gas, the surface of the interlayer insulating film 111 is protected by the resist 115, any irregularity is not formed on the surface of the interlayer insulating film 111.

Thereafter, an ITO film is formed on the picture element electrode and on the gate terminal 102b and on the source terminal in the same manner as in example 9, thus a TFT substrate is formed.

The same advantage can be achieved by performing the dry etching process of the interlayer insulating film 111, the passivation film 110 and the gate insulating film 104 in such a manner that after etching the interlayer insulating film 111 and the silicon nitride using $CF_4+O_2$, $SF_6+O_2$ or other fluorine gas+$O_2$, to remove the residue on the bottom part of the contact hole 112, an etching process is performed using $CF_4+O_2$, $SF_6+O_2$ or other fluorine gas+$O_2$ while increasing flow rate of $O_2$ gas.

In this example, the interlayer insulating film 111 is formed of a cheap acrylic transparent resin having no photosensitivity, and the patterning of the interlayer insulating film 111 is performed, using the resist 115 formed to protect the surface of the interlayer insulating film 111 as a mask, together with the etching of the passivation film 110. As a result, cost of material can be reduced, and the same advantage as in example 11 can be achieved without increasing number of manufacturing processes.

Example 13

Though the gate insulating film 104 on the gate terminal 102b in the assembly region 114 is etched, using the interlayer insulating film 111 or the resist 115 as a mask, after forming the interlayer insulating film 111 in the foregoing examples 9, 10, 11 and 12, the same advantage can be achieved by etching the gate insulating film 104 on the gate terminal 102b after forming the semiconductor layer 105 and the contact layer 106.

Figure 14:
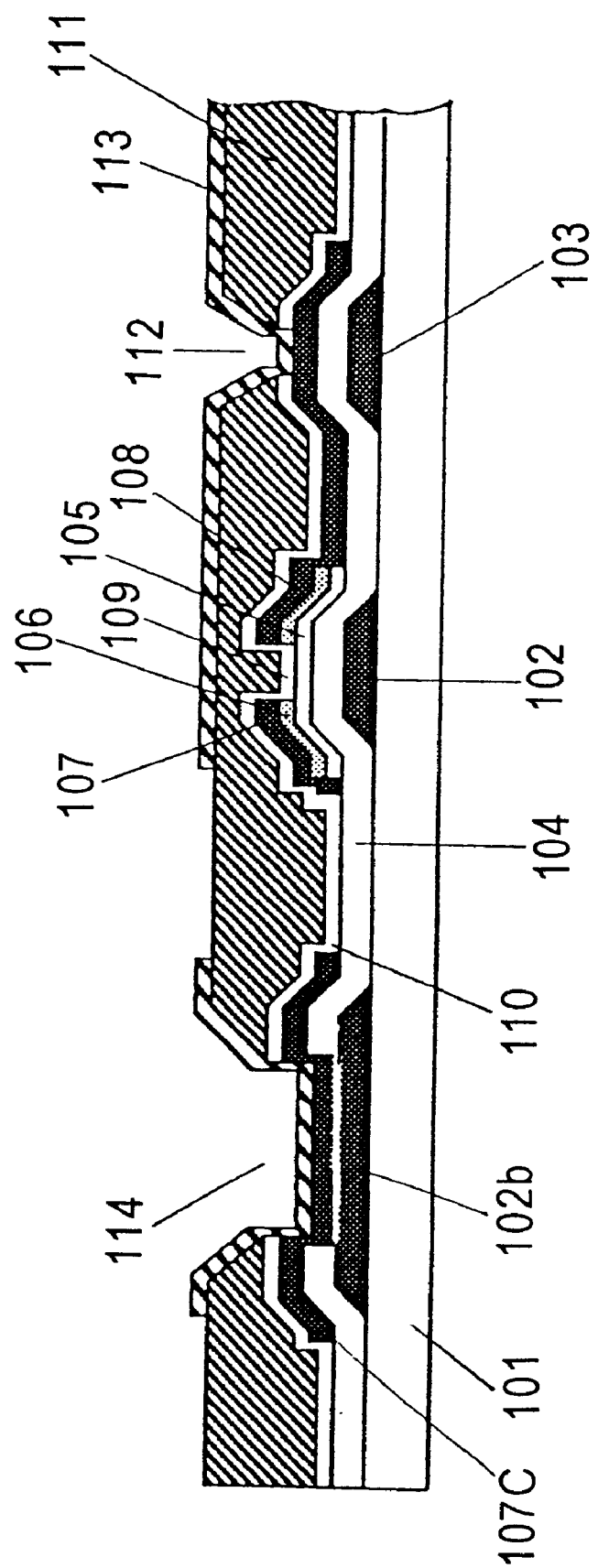
FIG. 14 is a sectional view showing the TFT array substrate of the liquid crystal display as defined in example 13 of the invention.
Figure 15:
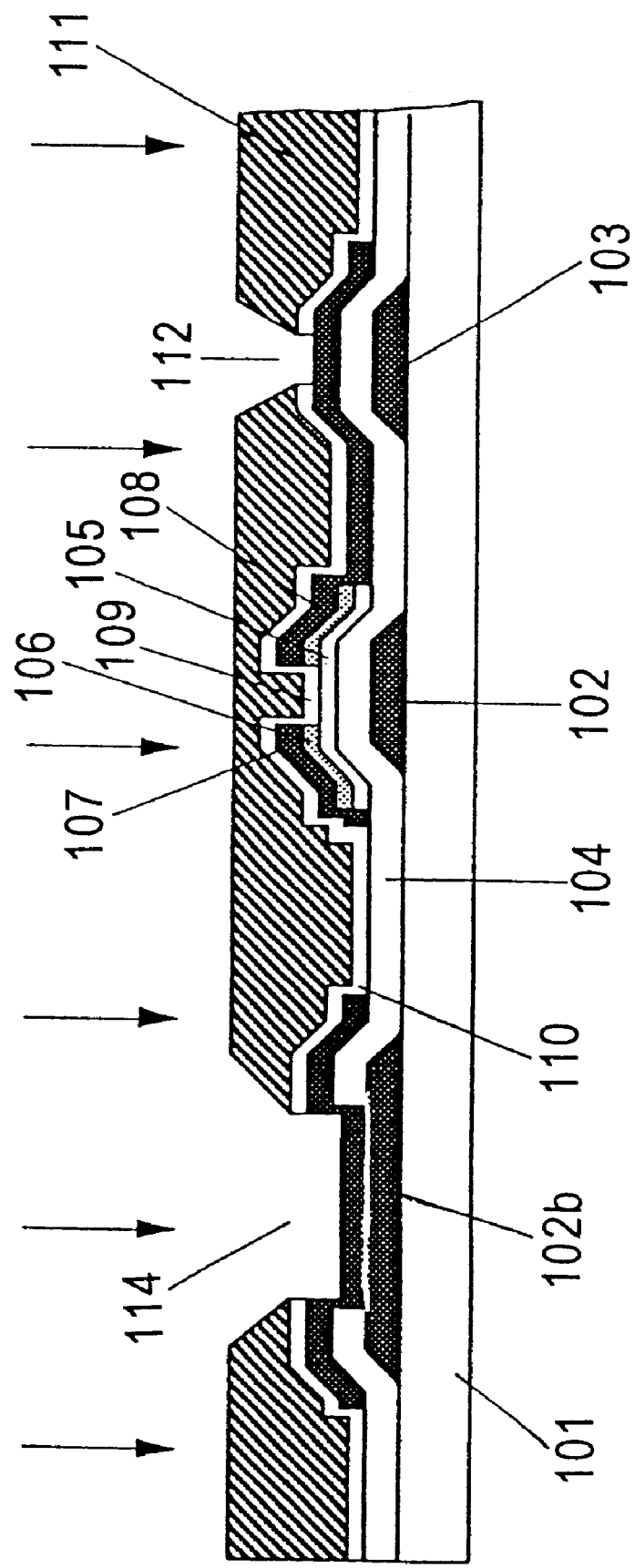
FIG. 15 is a sectional view showing a manufacturing step of the TFT array substrate of the liquid crystal display as defined in example 13 of the invention.

FIG. 14 is a sectional view showing a TFT array substrate of the liquid crystal display according to example 13 of the invention, and FIG. 15 is a sectional view showing a manufacturing step of the TFT array substrate shown in FIG. 14. In the drawings, same reference numerals are designated as in FIG. 11 and further description is omitted herein.

Now, a manufacturing process of the TFT array substrate of the liquid crystal display according to this example is hereinafter described.

In the same manner as example 9, gate electrode 102, gate electrode line (not shown), gate terminal 102b, common electrode 103, gate insulating film 104, semiconductor layer 105, and contact layer 106 are formed in order on a transparent insulating substrate 101.

Then, after forming a resist having an aperture pattern at a predetermined position by photomechanical process, the gate insulating film 104 in the assembly region 114 is etched by dry etching.

Then, a Cr film is formed by sputtering, and formation of a resist by photomechanical process and patterning by wet etching are performed. After forming the Cr film 107c on the source electrode 107, source electrode line (not shown), source terminal (not shown), drain electrode 108 and gate terminal 102b, amorphous silicon film (contact layer 106) of low resistance in the portion not coated with the source electrode 107 and the drain electrode 108 is etched by dry etching. Thus a channel section 109 is formed, whereby a TFT is formed.

Then, to protect the TFT, a silicon nitride film to be a passivation film 110 is formed by plasma CVD.

Then, to flatten the surface by covering the step produced due to the TFT and the electrode line, a photosensitive acrylic transparent resin is applied by spin coating, and a contact hole is formed by exposure and development. After forming a contact hole by applying exposure and development, an interlayer insulating film 111 is formed by breaching exposure and baking. At this time, as shown in FIG. 10, in the assembly region 114 in which the gate terminal 102b and the source terminal 107b are disposed for electrically connecting the gate electrode line 102a or the source electrode line 107a to an external substrate (not shown), the interlayer insulating film 111 is removed so as not to remain on the terminals 102b and 107b and between respective terminals 102b and 107b.

Then, using the interlayer insulating film 111 as a mask, the contact hole 112 is formed by etching the passivation film 110 exposed after forming the contact hole in the interlayer insulating film 111 by dry etching, and the passivation film 110 is etched in the assembly region 114. At this time, in the assembly region 114, the transparent insulating film 101 is exposed between respective terminals 102b and 107b.

FIG. 15 shows an etching process of the passivation film 110 by dry etching using the interlayer insulating film 111 as a mask. Dry etching condition of the passivation film 110 is as follows. After etching the silicon nitride forming the passivation film 110 using $CF_4+O_2$, $SF_6+O_2$ or other fluorine gas+$O_2$, to reduce the connection resistance between the picture element electrode 113 formed in the next step and the drain electrode 108, an ashing process is performed with $O_2$ gas, and residue on the drain electrode 108 of the bottom portion of the contact hole is removed. At this time, as the etching process using $CF_4+O_2$, $SF_6+O_2$ or other fluorine gas+$O_2$ and the ashing process $O_2$ gas are applied also to the surface of the interlayer insulating film 111, an irregularity is formed on the surface of the interlayer insulating film 111.

Then, for the purpose of reducing the irregularity on the surface of the interlayer insulating film 111 formed by the ashing process with $O_2$ gas, the etching process using $CF_4+O_2$, $SF_6+O_2$ or other fluorine gas+$O_2$ is performed again.

This second etching process using $CF_4+O_2$, $SF_6+O_2$ or other fluorine gas+$O_2$ is performed in shorter time than the first etching time to prevent sticking of the residue of the interlayer insulating film again to the contact hole 112. Otherwise, the second etching is performed using $CF_4+O_2$, $SF_6+O_2$ or other fluorine gas+$O_2$ while increasing flow rate of $O_2$ gas. Otherwise, the second etching is performed while reducing the power than that in the first etching. Otherwise, the second etching is performed by combining at least the foregoing two conditions of the process in shorter time, the increase flow rate of $O_2$ gas, and the reduction in power.

Then, an ITO film is formed by sputtering, and the picture element electrode 113 is formed on the interlayer insulating film 111 the ITO film 113a is formed on respective terminals 102b and 107b by formation of a resist by photomechanical process and by etching. At this time, the picture element electrode 113 is electrically connected to the drain electrode 108 through the contact hole 112.

In the etching of the ITO film, by reducing the irregularity on the surface of the interlayer insulating film 111 by applying again the etching process using $CF_4+O_2$, $SF_6+O_2$ or other fluorine gas+$O_2$ after the ashing process with $O_2$ gas in the previous step, etching speed of the ITO film on the interlayer insulating film 111 and the ITO film on the transparent insulating substrate 101 between respective terminals 102b and 107b in the assembly region 114 becomes almost the same. Thus, the picture element electrode 113 and the ITO film 113a in the assembly region 114 can be simultaneously patterned in one etching process.

An orientation film is formed on the surface of the opposite substrate with opposite electrode formed on another transparent insulating substrate and arranged oppositely to the TFT array substrate formed in the mentioned manner, and a liquid crystal display is formed by injecting a liquid crystal material therebetween.

In the etching of the ITO film forming the picture element electrode 113, when performing the etching process employing the optimum etching time for the ITO film on the transparent insulating substrate 101, side etching amount of the ITO pattern (picture element electrode 113) on the interlayer insulating film 111 is 1 $\mu$m or less on one side, thus a pattern of desirable configuration being achieved.

Connection resistance between the picture element electrode 113 and the drain electrode 108 was several hundred $\Omega$ or less at 35 $\mu$m☐.

Example 14

In the foregoing example 13, the etching process of the passivation film 110 using the interlayer insulating film 111 as a mask was performed first by the etching process of the passivation film 110 using $CF_4+O_2$, $SF_6+O_2$ or other fluorine gas+$O_2$, then by the ashing process with $O_2$ gas to remove the residue in the contact hole 112, and by the second etching process using $CF_4+O_2$, $SF_6+O_2$ or other fluorine gas+$O_2$. On the other hand, in this example, the etching process of the passivation film 110 is performed using $CF_4+O_2$, $SF_6+O_2$ or other fluorine gas+$O_2$, and the second etching process is performed by increasing flow rate of $O_2$ gas also using $CF_4+O_2$, $SF_6+O_2$, or other fluorine gas+$O_2$. As a result, connection resistance between the picture element electrode 113 and the drain electrode 108 can be reduced through the contact hole 112 by removing the residue on the bottom part of the contact hole 112, and irregularity on surface of the interlayer insulating film 111 can be reduced as compared with the ashing process with $O_2$ gas. Furthermore, at the time of forming the picture element electrode 113, etching characteristic of the ITO film on the interlayer insulating film 111 and the ITO film on the transparent insulating substrate 101 between respective terminals 102b and 107b in the assembly region 114 can be improved.

Example 15

Figure 16:
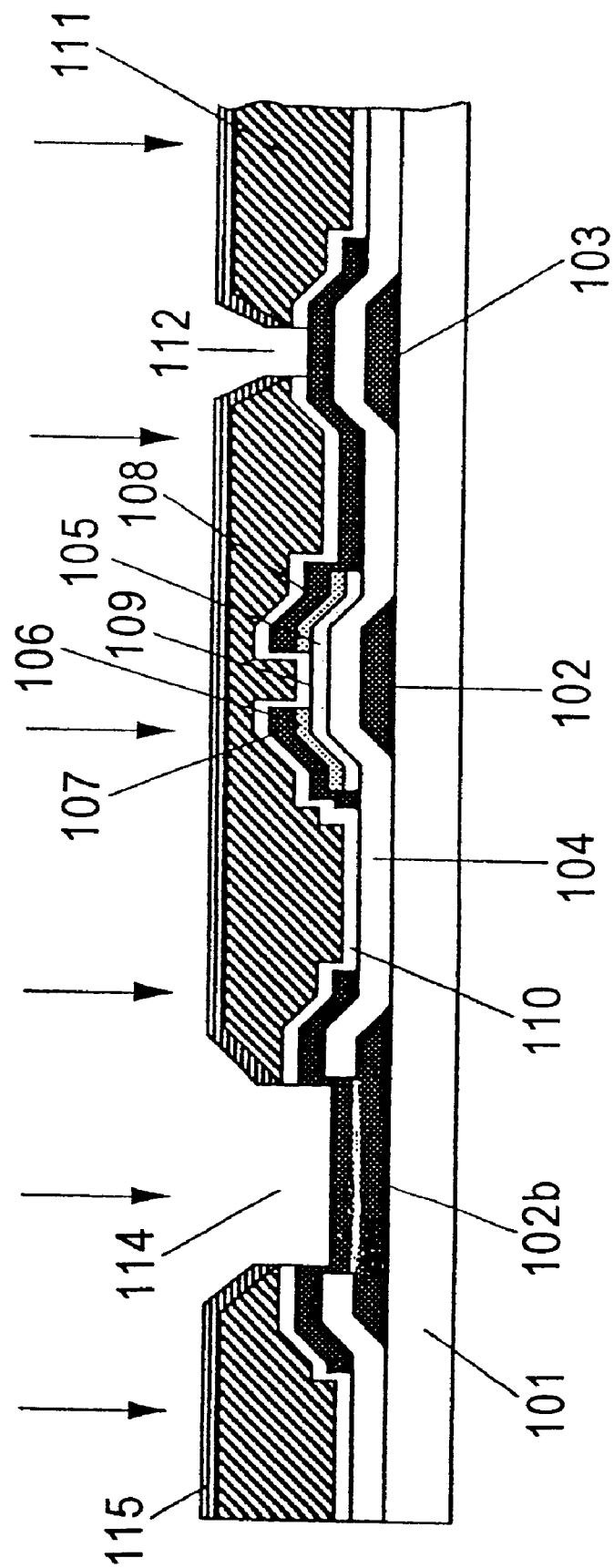
FIG. 16 is a sectional view showing a manufacturing step of the TFT array substrate of the liquid crystal display as defined in example 15 of the invention.

FIG. 16 is a sectional view showing a manufacturing step of the TFT array substrate of the liquid crystal display according to example 15 of the invention. In the drawing, same reference numerals as those in FIG. 12 are designated to the same or like parts and further description is omitted herein.

Now, a manufacturing process of the TFT array substrate of the liquid crystal display according to this example is hereinafter described.

In the same manner as in example 13, gate electrode 102, gate electrode line (not shown), gate terminal 102b, common electrode 103, gate insulating film 104, semiconductor layer 105, contact layer 106, source electrode 107, drain electrode 108, source electrode line (not shown), source terminal (not shown), channel section 109 and passivation film 110, are formed in order on a transparent insulating substrate 101.

Then, a photosensitive acrylic transparent resin is applied by spin coating or the like, and after forming a contact hole by applying exposure and development, an interlayer insulating film 111 is formed by breaching exposure and baking. At this time, as shown in FIG. 10, in the assembly region 114 in which the gate terminal 102b and the source terminal 107b are disposed for electrically connecting the gate electrode line 102a or the source electrode line 107a to an external substrate (not shown), the interlayer insulating film 111 is removed so as not to remain on the terminals 102b and 107b and between respective terminals 102b and 107b.

Then, a photo resist is applied on the interlayer insulating film 111, and after exposing the photo resist using the mask used at the time of exposing the mentioned acrylic transparent resin, a resist 115 of the same pattern as the interlayer insulating film 111 is formed by applying a development process.

Then, using the resist 115 as a mask, the contact hole 112 is formed by etching the passivation film 110 by dry etching, and the passivation film 110 in the assembly region 114 is etched.

In the dry etching process of the passivation film 110, after etching a silicon nitride forming the passivation film 110 using $CF_4+O_2$, $SF_6+O_2$, or other fluorine gas+$O_2$, residue on the bottom part of the contact hole 112 is removed, and to reduce the connection resistance between the picture element electrode formed in the next step and the drain electrode 108, an ashing process using $O_2$ gas is performed. The resist 115 is then removed. Note that at the time of ashing process using $O_2$ gas, as the surface of the interlayer insulating film 111 is protected by the resist 115, any irregularity is not formed on the surface of the interlayer insulating film 111.

Thereafter, an ITO film is formed on the picture element electrode and on respective terminals 102b and 107b in the same manner as in example 9, thus a TFT substrate is formed.

The same advantage can be achieved by performing the dry etching process of the passivation film 110 and the gate insulating film 104 in such a manner that after etching the silicon nitride using $CF_4+O_2$, $SF_6+O_2$ or other fluorine gas+$O_2$, to remove the residue on the bottom part of the contact hole 112, an etching process is performed using $CF_4+O_2$, $SF_6+O_2$ or other fluorine gas+$O_2$ while increasing flow rate of $O_2$ gas.

In this example, for the purpose of removing the residue on the bottom part of the contact hole 112, the ashing process using $O_2$ gas or the etching process using $CF_4+O_2$, $SF_6+O_2$ or other fluorine gas+$O_2$ while increasing flow rate of $O_2$ gas, is performed under protection of the surface of the interlayer insulating film 111 with the resist 115. As a result, any irregularity is not formed on the surface of the interlayer insulating film, and connection resistance between the picture element electrode and the drain electrode 108 can be reduced through the contact hole 112. Furthermore, at the time of forming the picture element electrode, etching speed of the ITO film on the interlayer insulating film 111 and that of the ITO film on the transparent insulating substrate 101 between respective terminals 102b and 107b in the assembly region 114 are almost the same, and the picture element electrode and the ITO film 113a is the assembly region 114 can be patterned by one etching process.

Example 16

Figure 17:
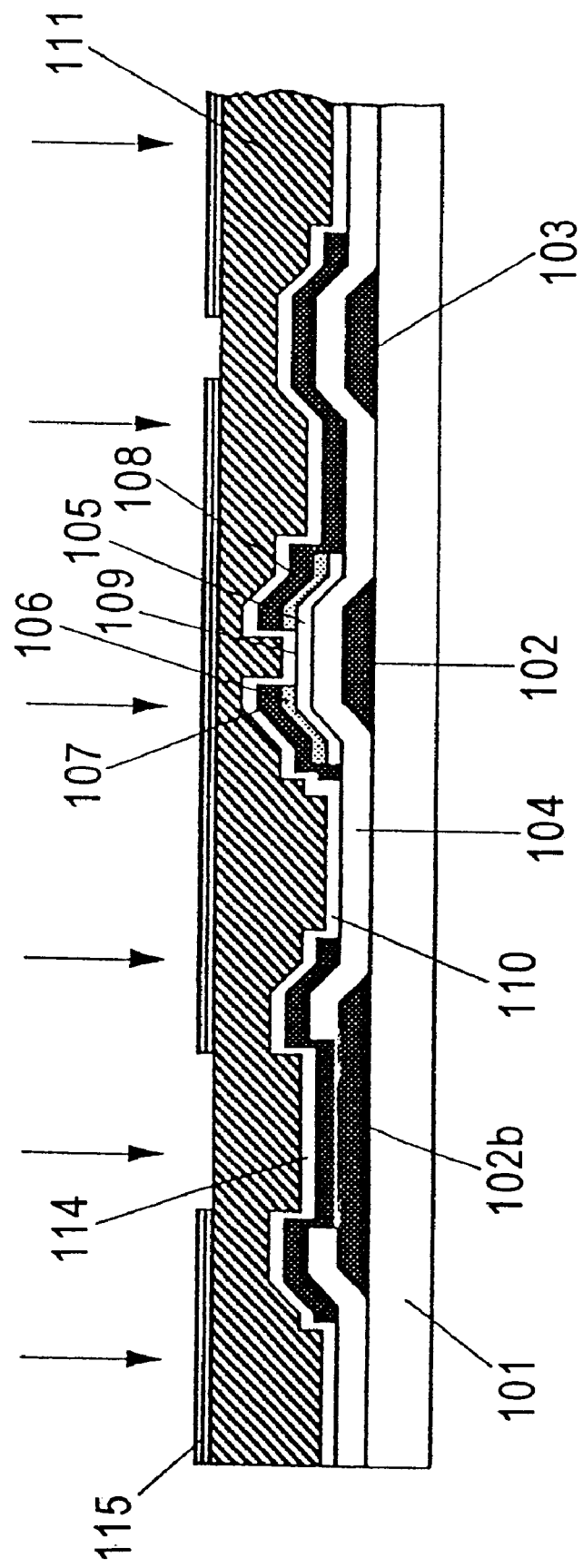
FIG. 17 is a sectional view showing a manufacturing step of the TFT array substrate of the liquid crystal display as defined in example 16 of the invention.
Figure 18:
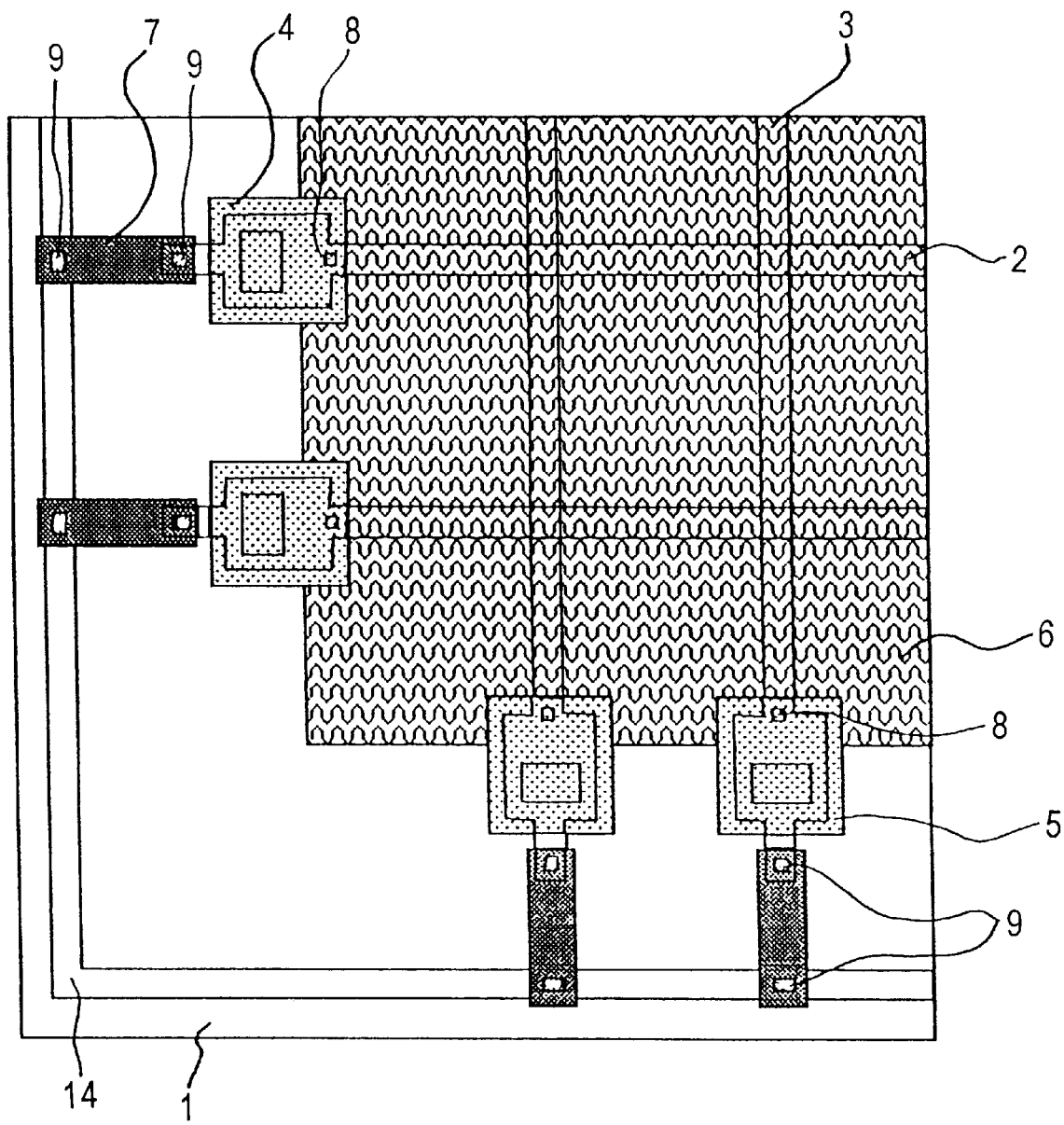
FIG. 18 is a partially top view showing a TFT array substrate of high aperture ratio according to the prior art.

FIG. 17 is a sectional view showing a manufacturing step of the TFT array substrate of the liquid crystal display according to example 16 of the invention. In the drawing, same reference numerals as those in FIG. 12 are designated to the same or like parts and further description is omitted herein.

Now, a manufacturing process of the TFT array substrate of the liquid crystal display according to this example is hereinafter described.

In the same manner as in example 13, gate electrode 102, gate electrode line (not shown), gate terminal 102b, common electrode 103, gate insulating film 104, semiconductor layer 105, contact layer 106, source electrode 107, drain electrode 108, source electrode line (not shown), source terminal (not shown), channel section 109 and passivation film 110, are formed in order on a transparent insulating substrate 101.

Then, an acrylic transparent resin having no photosensitivity is applied by spin coating or the like, and an interlayer insulating film 111 is formed by baking.

Then, a photo resist is applied on the interlayer insulating film, and after exposure and development, a resist 115 having an aperture pattern at a predetermined position is formed.

Then, using the resist 115 as a mask, the contact hole 112 is formed by etching the interlayer insulating film 111 and the passivation film 110 by dry etching. Then the interlayer insulating film 111 and the passivation film 110 in the assembly region 114 are etched.

In the dry etching process of the interlayer insulating film 111 and the passivation film 110, after etching a silicon nitride forming the interlayer insulating film 111 and the passivation film 110 using $CF_4+O_2$, $SF_6+O_2$ or other fluorine gas+$O_2$, residue on the bottom part of the contact hole 112 is removed, and to reduce the connection resistance between the picture element electrode formed in the next step and the drain electrode 108, an ashing process using $O_2$ gas is performed. The resist 115 is then removed. Note that at the time of ashing process using $O_2$ gas, the surface of the interlayer insulating film 111 is protected by the resist 115, any irregularity is not formed on the surface of the interlayer insulating film 111.

Thereafter, an ITO film is formed on the picture element electrode and on the gate terminal 102b and on the source terminal in the same manner as in example 13, thus a TFT substrate is formed.

The same advantage can be achieved by performing the dry etching process of the interlayer insulating film 111 and the passivation film 110 in such a manner that after etching the interlayer insulating film 111 and the silicon nitride using $CF_4+O_2$, $SF_6+O_2$ or other fluorine gas+$O_2$, to remove the residue on the bottom part of the contact hole 112, an etching process is performed using $CF_4+O_2$, $SF_6+O_2$ or other fluorine gas+$O_2$ while increasing flow rate of $O_2$ gas.

In this example, the interlayer insulating film 111 is formed of a cheap acrylic transparent resin having no photosensitivity, and the patterning of the interlayer insulating film 111 is performed, using the resist 115 formed to protect the surface of the interlayer insulating film 111 as a mask, together with the etching of the passivation film 110. As a result, cost of material can be reduced, and the same advantage as in example 15 can be achieved without increasing number of manufacturing processes.

Example 17

Though, in examples 9 to 16, the interlayer insulating film 111 is removed in such a manner that there remains no interlayer insulating film 111 between respective terminals 102b and 107b in the assembly region, it is also preferable that the interlayer insulating film 111 on the outside of the display region is entirely removed.

Though, in examples 9 to 16, the passivation film 110 is formed, it is also preferable to adopt a structure having no passivation film, and the interlayer insulating film 111 is formed directly on the TFT. In such a structure as having no passivation film, to manufacture the TFT array substrate according to examples 13 to 15, any etching process of the passivation film 110 using the interlayer insulating film 111 or the resist 115 as a mask is not required. Therefore, any process is not required other than the ashing process using $O_2$ gas to remove the residue in the contact hole 112, otherwise the etching process using $CF_4+O_2$, $SF_6+O_2$ or other fluorine gas+$O_2$ while increasing flow rate of $O_2$ gas.

In examples 9 to 16, any transparent resin other than acrylic resin can be used as a material for forming the interlayer insulating film 111.

In examples 9 to 16, for the purpose of improving in-plane homogeneity, such element as Ar, He, etc. can be added to the mentioned $CF_4+O_2$, $SF_6+O_2$ or other fluorine gas+$O_2$ used for dry etching in the step of forming the contact hole 112.

Though, in examples 9 to 16, an amorphous silicon is used as the semiconductor 105, but it is also preferable to use a polycrystalline silicon to apply it to the device on the uppermost layer of the picture element.

What is claimed is:

1. A manufacturing method of a liquid crystal display in which two transparent insulating substrates, at least on either of which an electrode is formed, are adhered facing to each other and a liquid crystal is held between the two transparent insulating substrates, comprising:

a step of forming a scanning electrode, a scanning electrode line and a scanning electrode line terminal on either of said two transparent insulating substrates;

a step of forming an insulating film on said scanning electrode, scanning electrode line and scanning electrode line terminal;

a step of forming a semiconductor layer on said scanning electrode through said insulating film;

a step of forming a first electrode, a first electrode line and a first electrode line terminal and a second electrode on said semiconductor layer;

a step of forming a passivation film on said first electrode, first electrode line, first electrode line terminal and second electrode;

a step of forming a contact hole on said second electrode and forming an interlayer insulating film having an aperture in an assembly region in which said scanning electrode line terminal and said first electrode line terminal are formed, by applying a transparent resin having a photosensitivity to said passivation film and by exposure and development;

a step of etching said passivation film and said insulating film exposed through said contact hole and said aperture by dry etching using said interlayer insulating film as a mask; and a step of forming a transparent conductive film on said interlayer insulating film, in said contact hole, on said transparent insulating substrates exposed through said aperture, on said scanning electrode line terminal and on the first electrode line terminal, and forming a picture element electrode electrically connected to said second electrode through said contact hole and forming a transparent conductive film pattern on the scanning electrode line terminal and on the first electrode line terminal by patterning in just one etching process;

wherein the etching process using the interlayer insulating film or the resist as a mask, the second etching process using $CF_4+O_2$, $SF_6+O_2$ or other fluorine gas+$O_2$ gas is performed by setting a flow ratio of $O_2$ gas to be higher than that in the first etching process, after completing the first etching process using $CF_4+O_2$, $SF_6+O_2$ or other fluorine gas+$O_2$ gas.

2. A manufacturing method of a liquid crystal display in which two transparent insulating substrates, at least on either of which an electrode is formed, are adhered facing to each other and a liquid crystal is held between the two transparent insulating substrates, comprising:

a step of forming a scanning electrode, a scanning electrode line and a scanning electrode line terminal on either of said two transparent insulating substrates;

a step of forming an insulating film on said scanning electrode, scanning electrode line and scanning electrode line terminal;

a step of forming a semiconductor layer on said scanning electrode through said insulating film;

a step of removing said insulating film in an assembly region in which said scanning electrode line terminal and a first electrode line terminal are formed;

a step of forming a first electrode, a first electrode line and a first electrode line terminal and a second electrode on said semiconductor layer;

a step of forming a passivation film on said first electrode, first electrode line, first electrode line terminal and second electrode;

a step of forming a contact hole on said second substrate and forming an interlayer insulating film having an aperture in an assembly region in which said scanning electrode line terminal and said first electrode line terminal are formed, by applying a transparent resin having a photosensitivity to said passivation film and by exposure and development;

a step of etching the passivation film exposed through said contact hole and the aperture by dry etching using said interlayer insulating film as a mask; and a step of forming a transparent conductive film on said interlayer insulating film, in said contact hole, on said transparent insulating substrates exposed through said aperture, on said scanning electrode line terminal and on the first electrode line terminal, and forming a picture element electrode electrically connected to said second electrode through said contact hole and forming a transparent conductive film pattern on the scanning electrode line terminal and on the first electrode line terminal by patterning in just one etching process;

wherein in the etching process by dry etching using the inter-layer insulating film as a mask, an ashing process using $O_2$ gas and a second etching process using $CF_4+O_2$, $SF_6+O_2$ or other fluorine gas+$O_2$ gas are performed, after completing a first etching process using $CF_4+O_2$, $SF_6+O_2$ or other fluorine gas+$O_2$ gas.

3. The manufacturing method of a liquid crystal display according to claim 2, wherein in the second etching process using $CF_4+O_2$, $SF_6+O_2$ or other fluorine gas+$O_2$ gas, the etching process is performed at a shorter time or by setting a flow ratio of $O_2$ gas to be higher or by setting a power to be smaller than that in the first etching process using $CF_4+O_2$, $SF_6+O_2$ or other fluorine gas+$O_2$ gas, or by combining at least two of said process conditions.

4. A manufacturing method of a liquid crystal display in which two transparent insulating substrates, at least on either of which an electrode is formed, are adhered facing to each other and a liquid crystal is held between the two transparent insulating substrates, comprising:

a step of forming a scanning electrode, a scanning electrode line and a scanning electrode line terminal on either of said two transparent insulating substrates;

a step of forming an insulating film on said scanning electrode, scanning electrode line and scanning electrode line terminal;

a step of forming a semiconductor layer on said scanning electrode through said insulating film;

a step of forming a first electrode, a first electrode line and a first electrode line terminal and a second electrode on said semiconductor layer;

a step of forming a passivation film on said first electrode, first electrode line, first electrode line terminal and second electrode;

a step of forming a contact hole on said second substrate and forming an interlayer insulating film having an aperture in an assembly region in which said scanning electrode line terminal and the first electrode line terminal are formed, by applying a transparent resin having a photosensitivity to said passivation film and by exposure and development;

a step of forming a resist by applying a photo-resist and patterning the photo-resist into the same configuration as the interlayer insulating film;

a step of removing the resist after etching the passivation film and the insulating film exposed through said contact hole and the aperture by dry etching using said resist as a mask; and a step of forming a transparent conductive film on said interlayer insulating film, in said contact hole, on said transparent insulating substrates exposed through said aperture, on said scanning electrode line terminal and on the first electrode line terminal, and forming a picture element electrode electrically connected to said second electrode through said contact hole and forming a transparent conductive film pattern on said scanning electrode line terminal and on the first electrode line terminal by patterning in just one etching process.

5. The manufacturing method of a liquid crystal display according to claim 4, wherein the insulating film in the assembly region in which the scanning electrode line terminal and the first electrode line terminal are formed is removed after forming the semiconductor layer and before forming the first electrode, the first electrode line, the first electrode line terminals and the second electrode.

6. The manufacturing method of a liquid crystal display according to claim 5, wherein in the etching process using the interlayer insulating film or the resist as a mask, the second etching process using $CF_4+O_2$, $SF_6+O_2$ or other fluorine gas+$O_2$ gas is performed by setting a flow ratio of $O_2$ gas to be higher than that in the first etching process, after completing the first etching process using $CF_4+O_2$, $SF_6+O_2$ or other fluorine gas+$O_2$ gas.

7. The manufacturing method of a liquid crystal display according to claim 5, wherein in the etching process by dry etching after forming the resist on the interlayer insulating film, an ashing process using $O_2$ gas is performed after the etching process using $CF_4+O_2$, $SF_6+O_2$ or other fluorine gas+$O_2$ gas.

8. The manufacturing method of a liquid crystal display according to claim 4, wherein in etching process by dry etching after forming the resist on the interlayer insulating film, an ashing process using $O_2$ gas is performed after the etching process using $CF_4+O_2$, $SF_6+O_2$ or other fluorine gas+$O_2$ gas.

9. The manufacturing method of a liquid crystal display according to claim 4, wherein in the etching process using the interlayer insulating film or the resist as a mask, the second etching process using $CF_4+O_2$, $SF_6+O_2$ or other fluorine gas+$O_2$ gas is performed by setting a flow ratio of $O_2$ gas to be higher than that in the first etching process, after completing the first etching process using $CF_4+O_2$, $SF_6+O_2$ or other fluorine gas+$O_2$ gas.

10. A manufacturing method of a liquid crystal display in which two transparent insulating substrates, at least on either of which an electrode is formed, are adhered facing to each other and a liquid crystal is held between the two transparent insulating substrates, comprising:
a step of forming a scanning electrode, a scanning electrode line and a scanning electrode line terminal on either of said two transparent insulating substrates;
a step of forming an insulating film on said scanning electrode, scanning electrode line and scanning electrode line terminal;
a step of forming a semiconductor layer on said scanning electrode through said insulating film;
a step of forming a first electrode, a first electrode line and a first electrode line terminal and a second electrode on said semiconductor layer;
a step of forming a passivation film on said first electrode, first electrode line, first electrode line terminal and second electrode;
a step of forming an interlayer insulating film by applying a transparent resin having no photosensitivity to said passivation film;
a step of forming a resist, and removing the resist after forming a contact hole on said second electrode and an aperture in an assembly region in which said scanning electrode line terminal and the first electrode line terminal are formed, by etching said interlayer insulating film, passivation film and insulating film by dry etching; and
a step of forming a transparent conductive film on said interlayer insulating film, in said contact hole, on said transparent insulating substrates exposed through said aperture, on said scanning electrode line terminal and on the first electrode line terminal, and forming a picture element electrode electrically connected to said second electrode through said contact hole and forming a transparent conductive film pattern on said scanning electrode line terminal and on the first electrode line terminal by patterning in just one etching process.

11. The manufacturing method of a liquid crystal display according to claim 10, wherein the insulating film in the assembly region in which the scanning electrode line terminal and the first electrode line terminal are formed is removed after forming the semiconductor layer and before forming the first electrode, the first electrode line, the first electrode line terminals and the second electrode.

12. The manufacturing method of a liquid crystal display according to claim 11, wherein in the etching process using the interlayer insulating film or the resist as a mask, the second etching process using $CF_4+O_2$, $SF_6+O_2$ or other fluorine gas+$O_2$ gas is performed by setting a flow ratio of $O_2$ gas to be higher than that in the first etching process, after completing the first etching process using $CF_4+O_2$, $SF_6+O_2$ or other fluorine gas+$O_2$ gas.

13. The manufacturing method of a liquid crystal display according to claim 10, wherein in the etching process using the interlayer insulating film or the resist as a mask, the second etching process using $CF_4+O_2$, $SF_6+O_2$ or other fluorine gas+$O_2$ gas is performed by setting a flow ratio of $O_2$ gas to be higher than that in the first etching process, after completing the first etching process using $CF_4+O_2$, $SF_6+O_2$ or other fluorine gas+$O_2$ gas.

14. The manufacturing method of a liquid crystal display according to claim 10, wherein in the etching process by dry etching after forming the resist on the interlaycr insulating film, an ashing process using $O_2$ gas is performed after the etching process using $CF_4+O_2$, $SF_6+O_2$ or other fluorine gas+$O_2$ gas.

15. A manufacturing method of a liquid crystal display in which two transparent insulating substrates, at least on either of which an electrode is formed, are adhered facing to each other and a liquid crystal is held between the two transparent insulating substrates, comprising:
a step of forming a scanning electrode, a scanning electrode line and a scanning electrode line terminal on either of said two transparent insulating substrates;
a step of forming an insulating film on said scanning electrode, scanning electrode line and scanning electrode line terminal;
a step of forming a semiconductor layer on said scanning electrode through said insulating film;
a step of forming a first electrode, a first electrode line and a first electrode line terminal and a second electrode on said semiconductor layer;
a step of forming a passivation film on said first electrode, first electrode line, first electrode line terminal and second electrode;
a step of forming a contact hole on said second electrode and forming an interlayer insulating film having an aperture in an assembly region in which said scanning electrode line terminal and said first electrode line terminal are formed, by applying a transparent resin having a photosensitivity to said passivation film and by exposure and development;
a step of etching said passivation film and said insulating film exposed through said contact hole and said aperture by dry etching using said interlayer insulating film as a mask; and a step of forming a transparent conductive film on said interlayer insulating substrates exposed through said aperture, in said contact hole, on said transparent insulating substrates exposed through said aperture, on said scanning electrode line terminal and on the first electrode line terminal, and forming a picture element electrode electrically connected to said second electrode through said contact hole and forming a transparent conductive film pattern on the scanning electrode line terminal and on the first electrode line terminal by patterning in just one etching process;

wherein in the etching process by dry etching using the inter-layer insulating film as a mask, an ashing process using $O_2$ gas and a second etching process using $CF_4+O_2$, $SF_6+O_2$ or other fluorine gas+$O_2$ gas are performed, after completing a first etching process using $CF_4+O_2$, $SF_6+O_2$ or other fluorine gas+$O_2$ gas.

16. The manufacturing method of a liquid crystal display according to claim 15, wherein in the second etching process using $CF_4+O_2$, $SF_6+O_2$ or other fluorine gas+$O_2$ gas, the etching process is performed in a shorter time or by setting a flow ratio of $O_2$ gas to he higher or by setting a power to be smaller than that in the first etching process using $CF_4+O_2$, $SF_6+O_2$ or other fluorine gas+$O_2$ gas, or by combining at least two of said process conditions.

17. A manufacturing method of a liquid crystal display in which two transparent insulating substrates, at least on either of which an electrode is formed, are adhered facing to each other and a liquid crystal is held between the two transparent insulating substrates, comprising:

a step of forming a scanning f electrode, a scanning electrode line and a scanning electrode line terminal on either of said two transparent insulating substrates;

a step of forming an insulating film on said scanning electrode, scanning electrode line and scanning electrode line terminal;

a step of forming a semiconductor layer on said scanning electrode through said insulating film;

a step of removing said insulating film in an assembly region in which said scanning electrode line terminal and a first electrode line terminal are formed;

a step of forming a first electrode, a first electrode line and a first electrode line terminal and a second electrode on said semiconductor layer;

a step of forming a passivation film on said first electrode, first electrode line, first electrode line terminal and second electrode;

a step of forming a contact hole on said second substrate and forming an interlayer insulating film having an aperture in an assembly region in which said scanning electrode line terminal and said first electrode line terminal are formed, by applying a transparent resin having a photosensitivity to said passivation film and by exposure and development;

a step of etching the passivation film exposed through said contact hole and the aperture by dry etching using said interlayer insulating film as a mask; and a step of forming a transparent conductive film on said interlayer insulating film, in said contact hole, on said transparent insulating substrates exposed through said aperture, on said scanning electrode line terminal and on the first electrode line terminal, and forming a picture element electrode electrically connected to said second electrode through said contact hole and forming a transparent conductive film pattern on the scanning electrode line terminal and on the first electrode line terminal by patterning in just one etching process; and in the etching process using the interlayer insulating film or the resist as a mask, the second etching process using $CF_4+O_2$, $SF_6+O_2$ or other fluorine gas+$O_2$ gas is performed by setting a flow ratio of $O_2$ gas to be higher than that in the first etching process, after completing the first etching process using $CF_4+O_2$, $SF_6+O_2$ or other fluorine gas+$O_2$ gas.

* * * * *